United States Patent [19]
Herrell et al.

[11] Patent Number: 5,963,023
[45] Date of Patent: Oct. 5, 1999

[54] POWER SURGE MANAGEMENT FOR HIGH PERFORMANCE INTEGRATED CIRCUIT

[75] Inventors: Dennis James Herrell; Thomas P. Dolbear, both of Austin, Tex.

[73] Assignee: Advanced Micro Devices, Inc., Sunnyvale, Calif.

[21] Appl. No.: 09/099,691

[22] Filed: Jun. 18, 1998

Related U.S. Application Data

[60] Provisional application No. 60/078,943, Mar. 21, 1998.

[51] Int. Cl.⁶ .............................. G05F 1/40; H03K 17/12
[52] U.S. Cl. ............................................. 323/265; 361/93
[58] Field of Search .................................... 323/265, 349, 323/908; 361/93, 100; 363/50

[56] References Cited

U.S. PATENT DOCUMENTS

| | | | |
|---|---|---|---|
| 3,880,493 | 4/1975 | Lockhart, Jr. | 339/147 |
| 4,275,313 | 6/1981 | Boll et al. | 326/87 |
| 4,322,778 | 3/1982 | Barbour et al. | 361/414 |
| 4,347,447 | 8/1982 | Proebsting | 327/108 |
| 4,543,494 | 9/1985 | Wakimoto | 327/108 |
| 4,612,457 | 9/1986 | Prater | 326/9 |
| 4,612,497 | 9/1986 | Ulmer | 323/315 |
| 4,636,918 | 1/1987 | Jodoin | 361/405 |
| 4,701,643 | 10/1987 | Laude et al. | 326/117 |
| 4,709,171 | 11/1987 | Main | 327/327 |
| 4,754,366 | 6/1988 | Hernandez | 361/306 |
| 4,782,252 | 11/1988 | Levy et al. | 327/388 |
| 4,906,866 | 3/1990 | Alexander et al. | 307/443 |
| 4,982,311 | 1/1991 | Dehaine et al. | 361/388 |
| 4,994,936 | 2/1991 | Hernandez | 361/306 |
| 5,034,850 | 7/1991 | Hernandez | 361/306 |
| 5,258,575 | 11/1993 | Beppu et al. | 174/52.4 |

(List continued on next page.)

OTHER PUBLICATIONS

Johnson, Randy et al., "A Feasibility Study of Ball Grid Array Packaging", NEPCON Conference, Jun. 14–17, 1993, pp. 413–422.

Lau, John H., "Ball Grid Array Technology", McGraw–Hill, Inc., New York, 1995, pp. 30, 48, 146–152, 208–219, 280–282, and 369–376.

Yip, Wai–Yeung and Tsai, Chi–Taou, "Electrical Performance of a Overmolded Pad Array Carrier (OMPAC)", Proceedings of the 1993 International Electronics Packaging Conference, vol. Two, Sep. 12–15, 1993, pp. 731–739.

Herrell, Dennis and Becker, Ben, "Power system design for high performance PC microprocessors", IEEE International Workshop on Chip–Package Codesign CPD '98, ETH Zürich, Switzerland, Mar. 24–26, 1998, pp. 46–47.

*Primary Examiner*—Adolf Daneke Berhane
*Attorney, Agent, or Firm*—Zagorin, O'Brien & Graham, LLP

[57] ABSTRACT

An integrated circuit chip configuration, e.g., a microprocessor, includes feedback control circuitry defined thereon to control mid-frequency components of current demand of the integrated circuit chip and thereby regulate power supply voltage to within design tolerances of the integrated circuit chip. Such mid-frequency components can be generated by directed changes in operating frequency of the integrated circuit chip or by cyclic or episodic variations in circuit activity, e.g., instruction sequence dependent variations. When generated, such mid-frequency components can excite mid-frequency resonances in a power distribution system and generate power supply voltage disturbances. In some configurations, the integrated circuit chip includes current dump circuitry defining a controlled impedance path between first and second power supply voltage terminals of the integrated circuit chip. The controlled impedance path allows the feedback control circuitry to actuate a variable current draw so as to reduce mid-frequency components of overall current demand of the integrated circuit chip and thereby regulate power supply voltage disturbances. In other configurations, the feedback control circuitry is coupled to on-chip clock circuits, e.g., a phase-locked loop (PLL), to actuate variations in a clock signal supplied to the integrated circuit chip and thereby regulate power supply voltage disturbances.

43 Claims, 13 Drawing Sheets

U.S. PATENT DOCUMENTS

| | | | |
|---|---|---|---|
| 5,377,079 | 12/1994 | Morita et al. | 361/752 |
| 5,386,336 | 1/1995 | Kim et al. | 361/93 |
| 5,475,565 | 12/1995 | Bhattacharyya et al. | 361/719 |
| 5,557,502 | 9/1996 | Banerjee et al. | 361/712 |
| 5,625,221 | 4/1997 | Kim et al. | 257/686 |
| 5,856,920 | 1/1999 | Buda et al. | 363/149 |

Current Flows

POWER SURGE MANAGEMENT FOR HIGH PERFORMANCE INTEGRATED CIRCUIT

This application claims benefit of U.S. Provisional application Ser. No. 60/078,943, filed Mar. 21, 1998.

BACKGROUND OF THE INVENTION

1. Field of the Invention

This invention relates to power distribution system design, and in particular to managing disturbances otherwise caused by time varying current demands in an integrated circuit.

2. Description of the Related Art

Microprocessors will soon reach operating frequencies of 500 MHz and 1 GHz is expected by the turn of the century. In such microprocessors, power dissipation will be more than 40 Watts with power supply voltage levels well below 2 Volts. With the microprocessor circuits demanding peak currents in excess of 100 Amps, providing a well-regulated power (better than 10%) is a difficult challenge requiring careful optimization of chip, package, card and system.

With an average power dissipation on the order of 40 Watts, at a power supply voltage of 2 Volts, the average (i.e., RMS) current drawn by a microprocessor operating at full speed can exceed 20 Amps. Within each cycle, the peak current can be at least two times the average current. We can, therefore, expect peak currents of 40 to 50 Amps with a major high-frequency component at the nominal operating frequency (e.g., 500 MHz–1 GHz). However, as the microprocessor cycles through subroutines, enters or leaves stop-clock conditions, or even exhibits linear instruction sequence dependent variations in current demands, current surges can have additional frequency components up to the nominal operating frequency and including higher order harmonics. A well designed power distribution system should provide a well-regulated supply over the complete frequency range from the full clock speed, down through mid-frequencies, to very low frequencies characterized by sleep modes.

A variety of techniques are available to improve the AC impedance characteristics of a power distribution system. These techniques include optimal placement of decoupling structures/devices, chip layout with respect to power distribution, Controlled Collapse Chip Connection (C4) and Ball Grid Array (BGA) ball allocations associated with the supply voltages ($V_{DD}$ and $V_{SS}$), BGA package design and layers, card layout and discretes placed on the card, connector suitability and $V_{DD}/V_{SS}$ allocations, and lastly the motherboard layout, regulator choice and associated discrete components.

Unfortunately, despite conventional techniques, the trend toward lower voltages, higher currents, and higher operating frequencies creates both a greater susceptibility to power supply voltage collapse and undershoot and greater likelihood of same. Even after exploiting impedance tuning techniques, the AC impedance of a power distribution system is likely to exhibit mid-frequency resonances. Such resonances, when excited by sub-nominal operating frequency variations in current demands, can result in substantial excursions in on-chip power supply voltage which can adversely affect integrated circuit operation.

Large variations in current demands likely to excite such mid-frequency resonances can be caused by transitions between a nominal operating frequency and sleep (or stop clock) operating frequencies. In addition, such variations in current demands can be caused as the microprocessor cycles through instruction sequences. Even temporal variations in the set of execution units, busses, and corresponding circuits drawing current may excite mid-frequency components in overall current demand, which can result in excursions in on-chip power supply voltage. Data sequence dependent variations in current demands have similar effects.

SUMMARY OF THE INVENTION

Accordingly, a novel integrated circuit chip configuration, e.g., a microprocessor, includes feedback control circuitry defined thereon to control mid-frequency components of current demanded by the integrated circuit chip, e.g., by reducing amplitude of current surge which would excite such components, and thereby regulate power supply voltage to within design tolerances of the integrated circuit chip. Mid-frequency components can be excited by directed changes in operating frequency of the integrated circuit chip or by cyclic or episodic variations in circuit activity, e.g., instruction sequence dependent variations. When generated, current surges can excite mid-frequency resonances in a power distribution system and generate power supply voltage disturbances. In some configurations, the integrated circuit chip includes current dump circuitry defining a controlled impedance path between first and second power supply voltage terminals of the integrated circuit chip. The controlled impedance path allows the feedback control circuitry to actuate a variable current draw so as to reduce current surge of the integrated circuit chip and thereby reduce excitations of mid-frequency components of power distribution system response which, in turn, reduces power supply voltage disturbances. In other configurations, the feedback control circuitry is coupled to on-chip clock circuits, e.g., a phase-locked loop (PLL), to actuate variations in a clock signal supplied to the integrated circuit chip and thereby adjust the current surge and, in turn, reduce power supply voltage disturbances.

In one embodiment in accordance with the present invention, a method for reducing current surge induced disturbances in a power supply voltage delivered to an integrated circuit by a power distribution system includes sensing the power supply voltage delivered at the integrated circuit and, in closed-loop response to the sensing, performing a control action to regulate the power supply voltage to within a predetermined dV/V characteristic. The control action is selected to reduce a sub-nominal operating frequency component of current drawn by the integrated circuit, wherein the power distribution system exhibits increased AC impedance at the sub-nominal operating frequency. In some embodiments in accordance with the present invention, a method further includes passing current through a current dump circuit and controllably varying the passed current in response to a sensed onset of a disturbance in the power supply voltage. In some embodiments, a method includes controllably varying an actual operating frequency of at least a substantial portion of circuits defined on the integrated circuit in response to a sensed onset of a disturbance in the power supply voltage.

In another embodiment in accordance with the present invention, a method for reducing disturbances in a power supply voltage delivered to a microprocessor integrated circuit chip by a power distribution system exhibiting increased AC impedance at mid-frequencies less than a nominal operating frequency of the microprocessor includes sensing the power supply voltage delivered to the microprocessor and regulating the power supply voltage on-chip to within a power supply voltage level envelope within which devices and circuits of the microprocessor are reliably operable. The regulating is by performing a control action to reduce mid-frequency components of current supplied by the power distribution system. In some embodiments in accordance with the present invention, the control action includes controllably selecting a high-current instance or a low-current instance of circuitry. In some embodiments, the sensing and performing a control action to reduce mid-frequency components of current supplied by the power distribution system are at least partially performed by a non-linear resistor (NLR).

In yet another embodiment in accordance with the present invention, an integrated circuit chip includes first circuitry and a feedback control circuit defined thereon. The first circuitry is operable to exhibit variations in current demand in response to temporal variations in an operating characteristic thereof. In addition, the first circuitry is couplable to define, in conjunction with components external to the integrated circuit chip, a power distribution system exhibiting AC impedance characteristics having a mid-frequency resonance, wherein the first circuitry is nominally operable at a high-frequency greater than the mid-frequency, and wherein the mid-frequency resonance is excitable by the variations in current demand to cause disturbances in power supply voltage delivered on-chip. The feedback control circuit is responsive to the disturbances in power supply voltage to control overall current demand of the integrated circuit chip and thereby regulate the disturbances to within a design tolerance of the integrated circuit chip. In various embodiments, the temporal variations in operating characteristic include (a) temporal variations in a desired operating frequency, (b) transitions amongst a nominal operating frequency and a sleep or stop clock operating frequency, or (c) instruction sequence dependent variations in current requirements of the integrated circuit chip.

BRIEF DESCRIPTION OF THE DRAWINGS

The present invention may be better understood, and its numerous objects, features, and advantages made apparent to those skilled in the art by referencing the accompanying drawings.

FIG. 10B depicts transient response to a staged increase and decrease in operating frequency so as to limit the magnitude a on-chip power supply voltage disturbances.

The use of the same reference symbols in different drawings indicates similar or identical items.

DESCRIPTION OF THE PREFERRED EMBODIMENT(S)

Figure 5A:
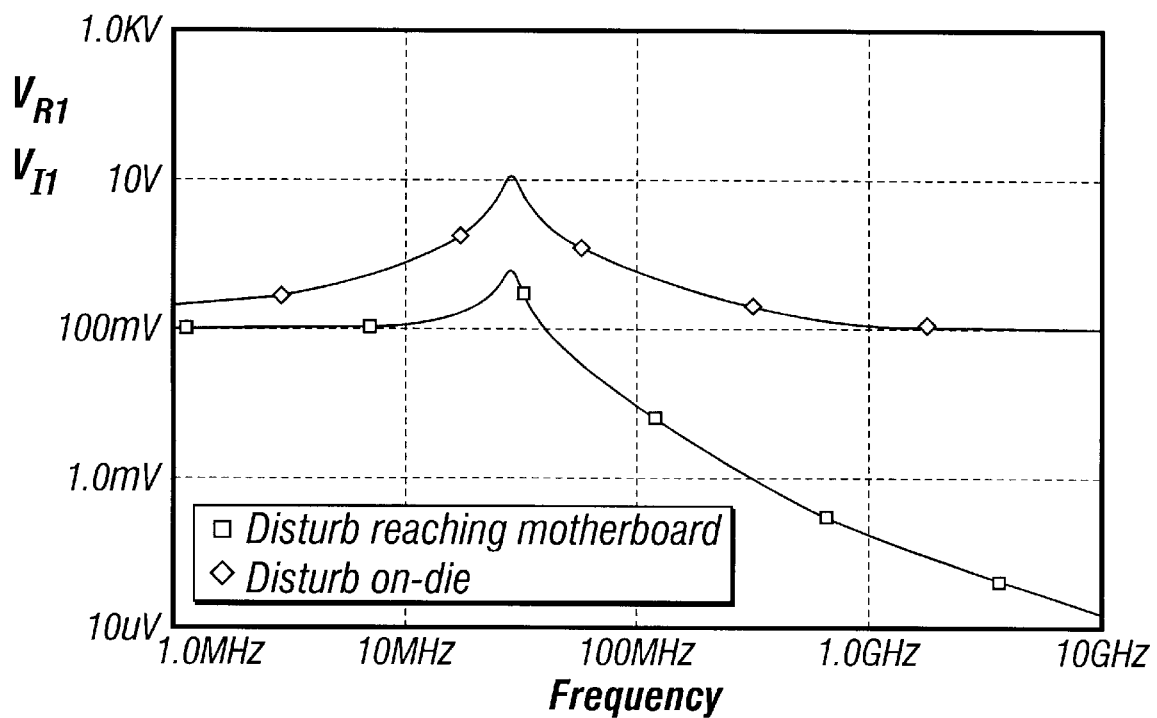
FIGS. 5A and 5B depict a further refinement of an exemplary model of a power distribution system that includes on-die capacitance and the AC response characteristics for disturbances on-die and reaching a motherboard.
Figure 5B:
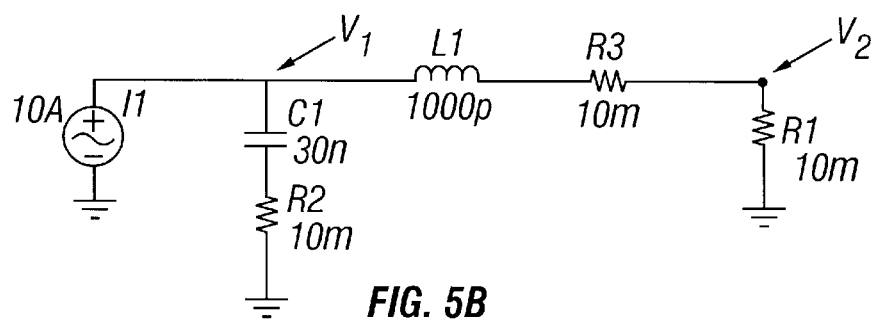
Figure 6A:
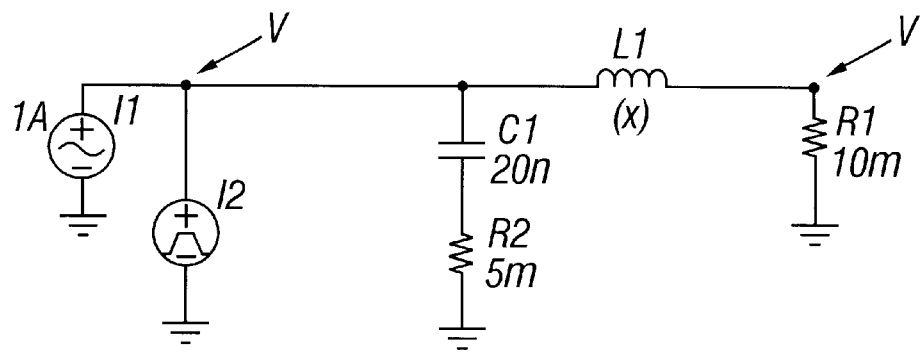
FIGS. 6A, 6B and 6C depict AC responses and transient responses for another exemplary model of a power distribution system and illustrate an effect of supply inductance on the mid-frequency resonances in the power distribution system.
Figure 6B:
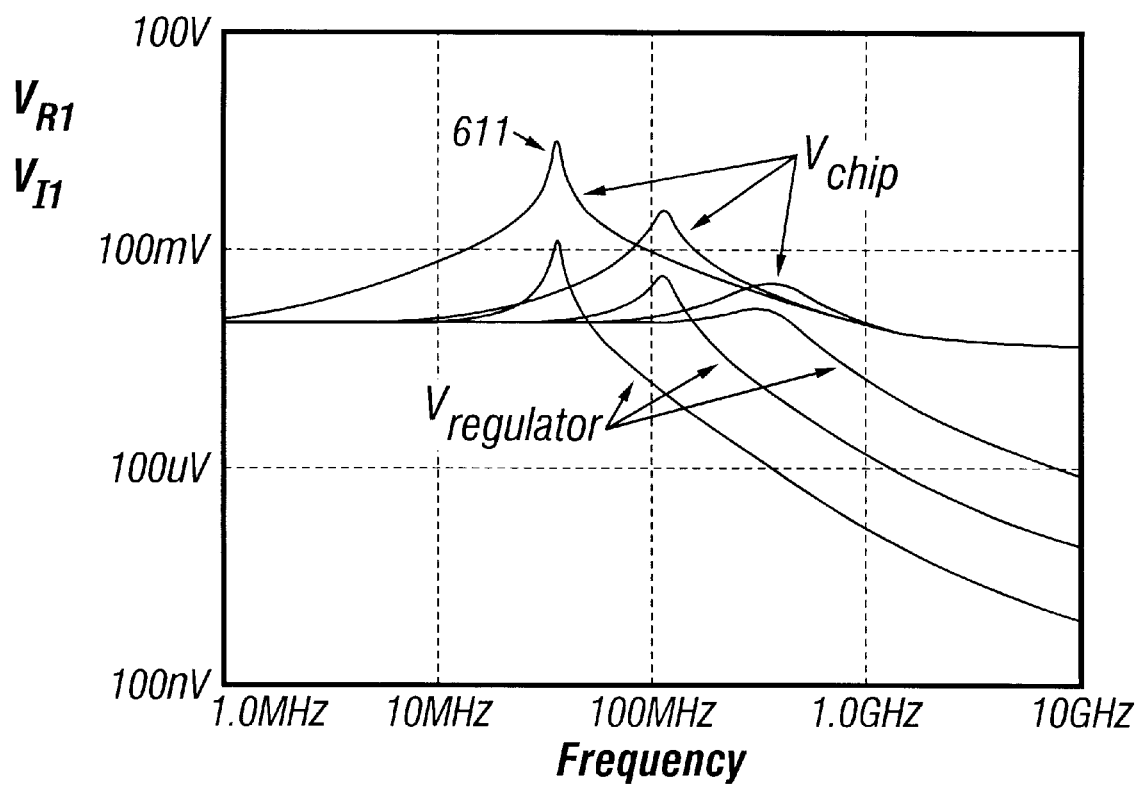

Referring to FIG. 5B, a power distribution system from a switched power regulator, located on a motherboard, to the circuits on a die can be represented from an AC perspective as a simple RLC filter network, where $R_1$ represents the regulator impedance, and $C_1$ represents the on-die capacitance of the circuits. The AC current source $I_1$ can be considered as the surge current to or from the switching devices. Voltage $V_1$ is then the level of an AC disturbance impressed upon the supplied DC power voltage and voltage $V_2$ represents the disturb that reaches the regulator on the motherboard. The circuit has a simple response as shown in FIG. 5A, (or as shown in FIG. 6B for three values of power supply inductance $L_1$), that has a resonance in the mid-frequency range between 10 MHz and 100 MHz for parameter values typical of PC systems. At low frequencies, the response follows $R+\omega L_1$, where $L_1$ is the effective inductance of the distribution system. At high frequencies, the response rolls off as $1/\omega C_1$, where $C_1$ is again the on-die capacitance.

A primary design challenge is to be able to reduce the peak of the power system response (dV) sufficiently for the transient performance of the supply voltage to remain within tight bounds around the nominal power supply voltage ($V=V_{DD}-V_{SS}$). Typically, we require $dV/V<0.1$. Even though the AC impedance at the clock frequency can be well within these bounds, such a dV/V characteristic can be very difficult to achieve at the mid-frequency peak of the response. This peak is excited and governs the response when we have step function changes in the current, such as evoked by stop clock or by a transition to a snooze mode. In general, such current surges can be caused by transitions (up or down) between operating frequencies.

In addition, variations in current demands can be caused as a microprocessor cycles through instruction sequences that correspond to circuit operations with cyclic variations current demands. Even temporal variations in the set of execution units, busses, and corresponding circuits drawing current may excite mid-frequency components in overall current demand, which, if substantial, can result in out of bounds excursions in on-chip power supply voltage. Data sequence dependent variations in current demands may have similar effects. Such additional sources of current surge will become increasingly significant as supply voltages decrease from 2 V to 1.5 V (or lower) and as operating frequency, current requirements and power dissipation increase for integrated circuit chips such as high performance microprocessors.

Figure 6C:
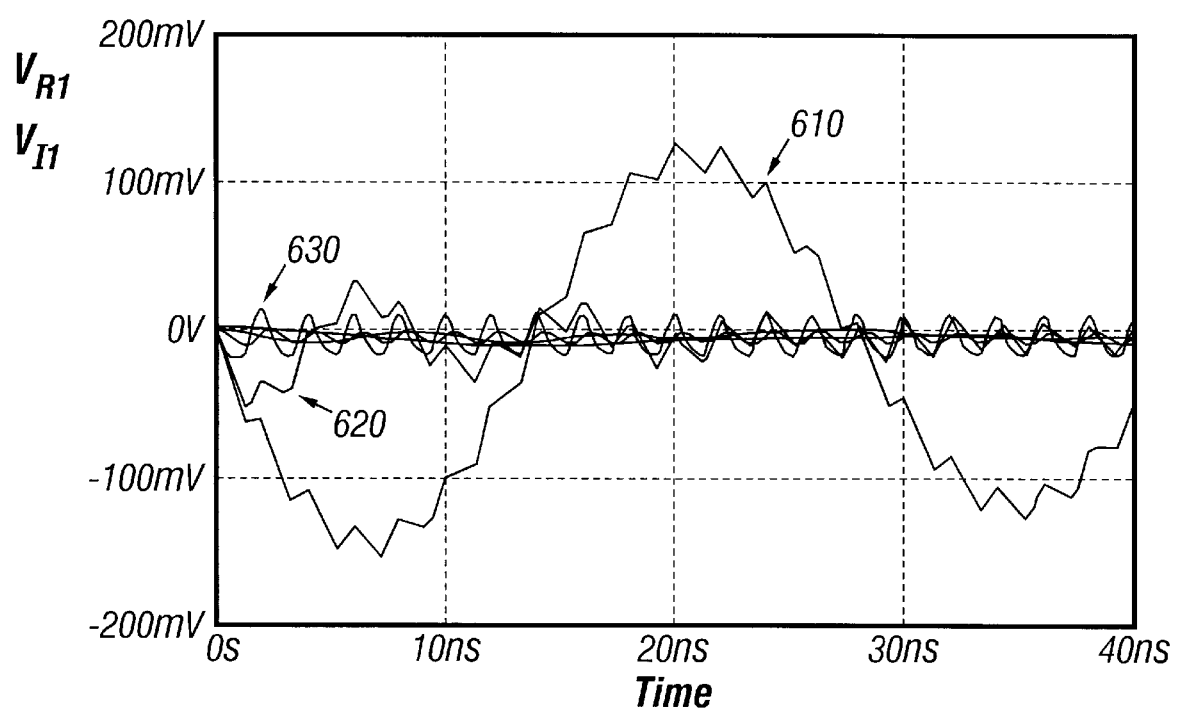

In FIG. 6C, the transient response of voltage on-die (e.g., voltage $V_1$ in FIG. 6A) is measured for a 2 ns period (i.e., 500 MHz) current waveform $I_1$ with an amplitude of 1 A. At T=0 ns, current $I_1$ transitions from essentially a zero DC current to 1 A AC current at 500 MHz. Multiple curves show the transient response as a function of power supply inductance. In particular, the largest response 610 corresponds to the largest power supply inductance. Note, that the power system "rings" at the frequency characterized by the peak in the AC response (see response 611 of FIG. 6B).

One way to cut the peak amplitude of the AC response is to increase the on-die capacitance. Additional on-die capacitance is usually achieved by adding large area transistors to an integrated circuit chip and utilizing the gate oxide of the large area transistors as the dielectric. In general, chip designers are willing to use "white space" for these capacitors provided that they do not seriously affect the die-area and yield. However, present and future designs require more capacitance than can conveniently be obtained through this technique and additional die area is required. For high performance integrated circuits, e.g., microprocessors operating at nominal frequencies of greater than 500 MHz, at voltages less than 2 V, and currents greater than 20 A, hundreds of nF of on-die capacitance may be required.

Package design can also contribute to reductions in the peak amplitude of an AC response. For example, on-package capacitors can be effective, particularly at the peak frequencies, if we can provide low inductance connections to these locations. Under-the-package capacitors on the card can also be particularly effective if we can, once again, achieve a low inductance connection to them. This can be done by reserving a large number of C4s, package vias, balls and Plated Through Holes (PTH) for the power supply connection to under-the-package capacitors. In particular, a novel low inductance arrangement is described in a co-pending patent application entitled, "Low Impedance Power Distribution System for a Microprocessor," <atty. docket no.: M-5638 U.S.> naming Herrell and Dolbear as inventors, and filed on even date herewith, the entirety of which is hereby incorporated by reference. Power connection components further from the die, such as the card power planes, connector pins, and motherboard connections have less of an effect upon the response as these can be effectively isolated through conventional decoupling capacitor schemes.

Unfortunately, despite the above techniques, the trend toward lower voltages, higher currents, and higher operating frequencies creates both a greater susceptibility to power supply voltage collapse and overshoot and greater likelihood of same. Even after exploiting impedance tuning techniques, the AC impedance of a power distribution system is likely to exhibit mid-frequency resonances. Such resonances, when excited by sub-nominal operating frequency variations in current demands, can result in substantial excursions in on-chip power supply voltage. If outside design tolerances, such excursions can adversely affect circuits and devices of an integrated circuit. For example, transient overvoltages may result in improper circuit operation or even device failures. Transient undervoltages may cause improper circuit operation, for example due to failure to exceed threshold voltages.

Power System Design

Figure 1A:
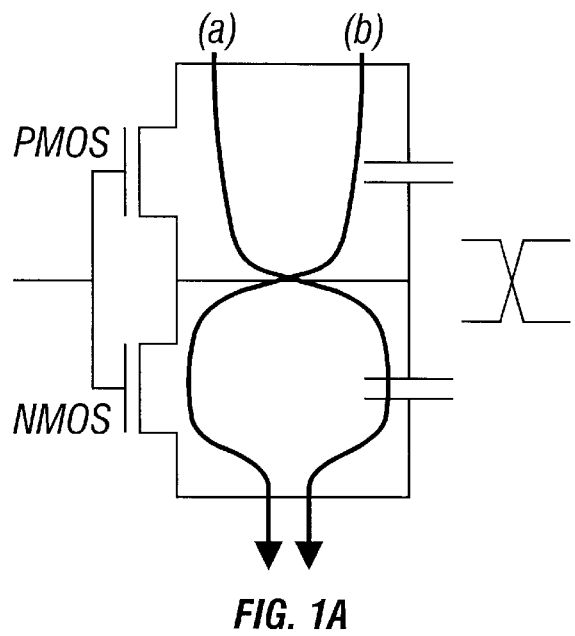
FIG. 1A depicts a hypothetical circuit representative of a group of CMOS inverter circuits.
Figure 1B:
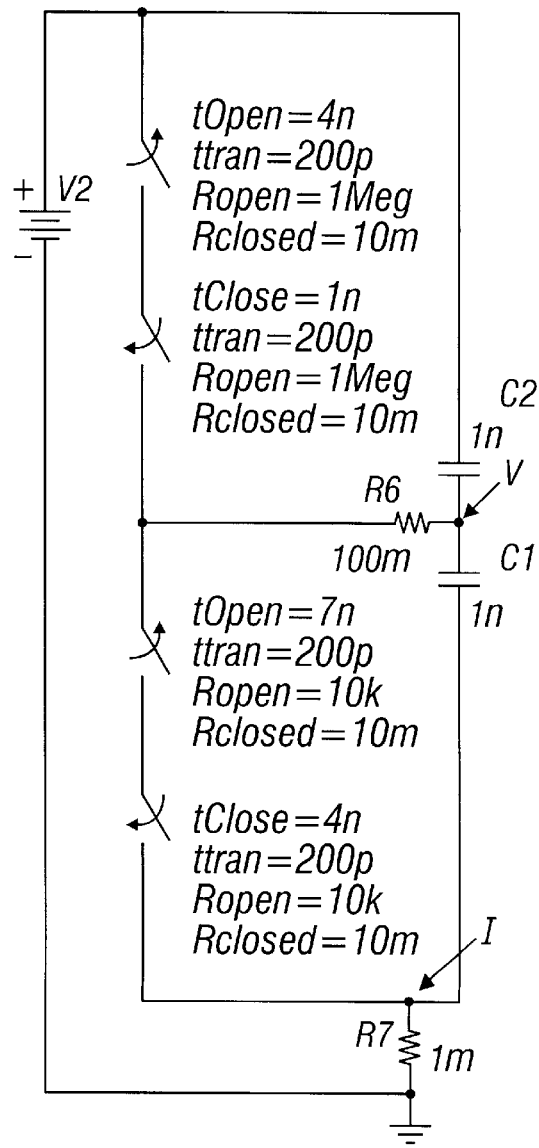
FIG. 1B depicts a switch abstraction thereof.

To illustrate the power supply problem, it is important to understand how the circuits on a chip draw current from the power supply. FIG. 1A, depicts a CMOS inverter circuit and shows the current flows (a) when the output is being asserted high and (b) when the output is being asserted low. In both cases, current flows from the positive side of the power supply to ground. In general, current flows from a first power supply voltage node, typically referred to as $V_{DD}$, toward a second power supply voltage node, typically referred to as $V_{SS}$. FIG. 1B shows a switch abstraction of the inverter circuit.

Figure 2A:
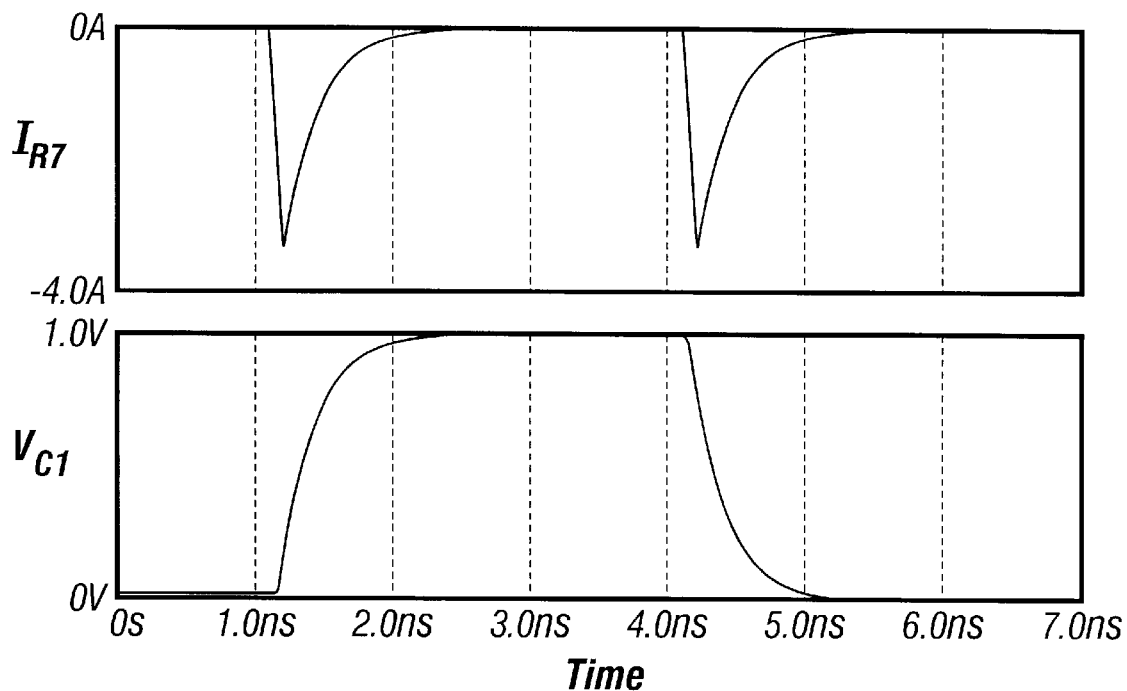
FIGS. 2A and 2B depict current flow demanded by circuits such as shown in FIG. 1A in time and frequency domains respectively.
Figure 2B:
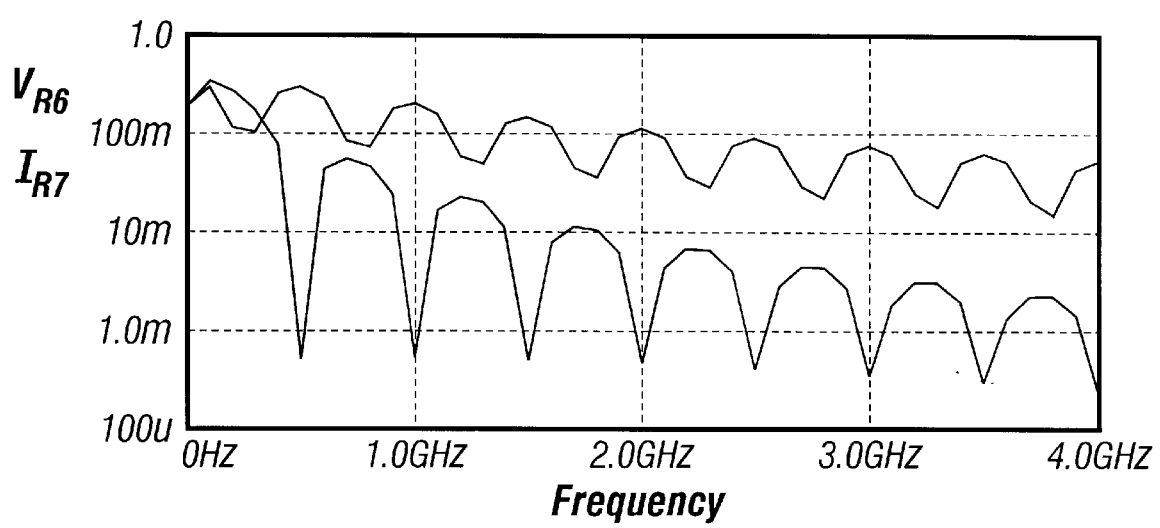

As shown in FIG. 2A, the current flow demanded by such circuits is periodic as the circuits typically operate each cycle of the processor clock. In general, FIG. 2A is representative of the periodicity of total current demands for an integrated circuit. FIG. 2B, depicts a Fast Fourier Transform (FFT) of the periodic current waveform and illustrates the harmonic frequency content of the periodic current. Such a current waveform will excite harmonics across the frequency band from zero Hz (or DC) to, in the particular case depicted, 4 GHz. In general, these waveforms are very good exciters of harmonics across the frequency band. Given such frequency components, we turn our attention to what an ideal power delivery system would look like.

Figure 3A:
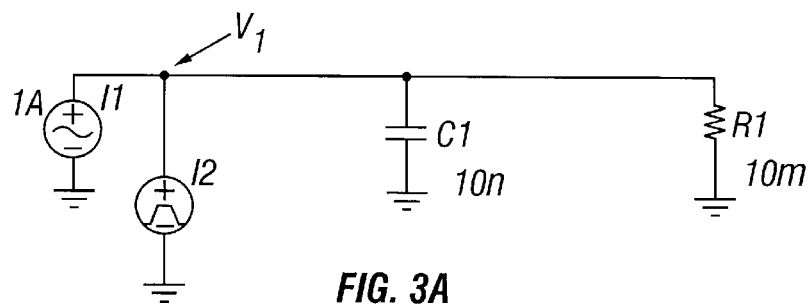
FIGS. 3A, 3B and 3C depict AC response and transient response for a model of an idealized power distribution system.
Figure 3B:
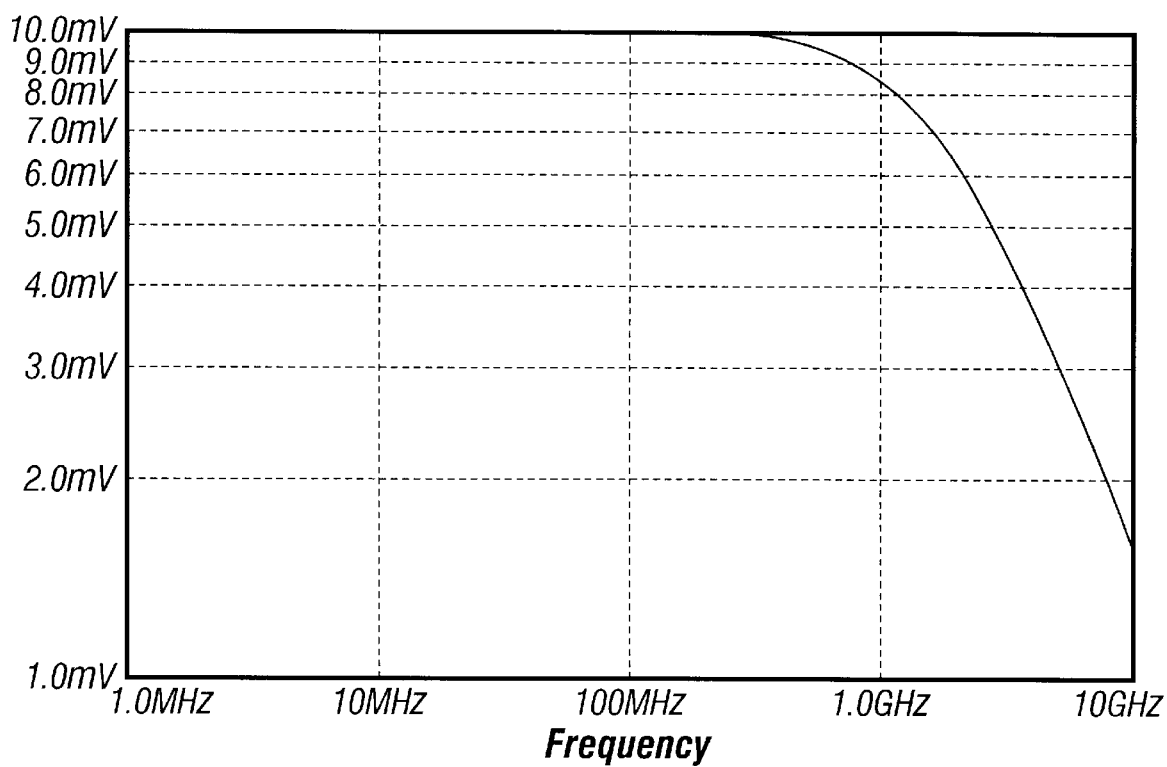

FIG. 3A illustrates connection of a power supply, e.g., a battery, across the power supply terminals of an integrated circuit. Such a power supply provides the current required by the circuits that are switching. In this idealized illustrative circuit, only the impedance of the battery, $R_1$, is shown. $C_1$ includes capacitance on chip. Switching of devices on-chip is represented by the switching current source, $I_2$.

Figure 3C:
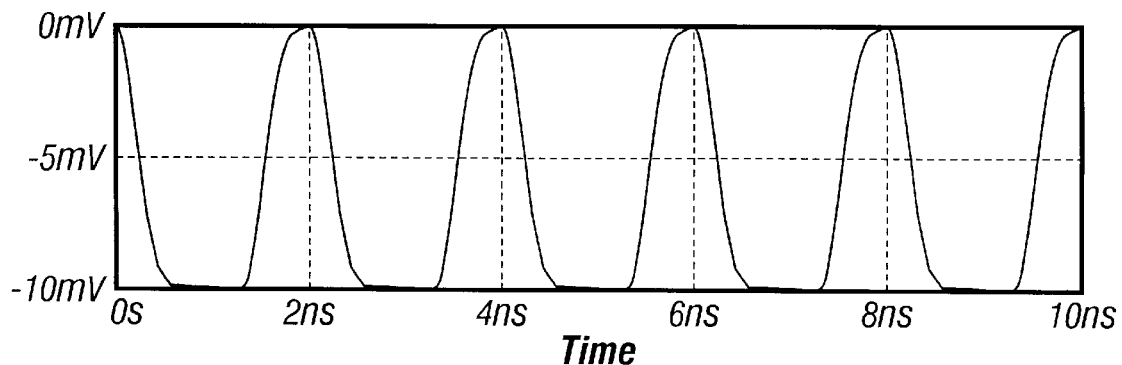

FIG. 3C illustrates the transient response of the voltage, $V_1$, as measured at the chip. This voltage is the disturbed voltage caused by periodic drawing of current by the circuit represented by current source, $I_2$. In that case, voltage variance (dV) of about 10 mV is within a dV/V spec of 10% assuming nominal power supply voltage of 2 V to the device. FIG. 3C depicts the AC response of this power distribution system, i.e., the AC response as seen by the switching circuits as they look back towards the power supply. With this very simple circuit, we see an AC response with a constant impedance at low frequencies, which then rolls off at high frequencies between 1 and 10 GHz. In this particular case, a current source of 1 A is used to "interrogate" the impedance of the power distribution system for the AC response. So we see that we have 10 mV of voltage at low frequencies which really corresponds to the 10 mΩ of resistance assumed for the power supply, i.e., the 10 mΩ of $R_1$. Typically, in later diagrams we will use a 1 A source and directly convert the mV of the AC response directly to mΩ.

A design objective for the power distribution system is to reduce the magnitude of this disturbance in voltage, dV, and in particular, to reduce the magnitude of dV compared to the DC static voltage, V, that we're trying to impress. Typically we'd like to have dV/V be less than 10% under all conditions. In the case of a microprocessor integrated circuit, we are principally interested in reducing the magnitude of dV/V associated with switching by circuits in the core of the microprocessor, which makes up the major number of circuits on the microprocessor chip. So we have the rate of change of current, di/dt, from the core circuits. That di/dt is cyclic since typical core circuits are switching every cycle at the operating frequency of the microprocessor. However, di/dt can also include other frequency components. In particular, episodic components or subharmonic frequencies of the operating frequency will may also be present. For example, because some circuits may only be exercised every Nth cycle, or because the set of circuits exercised may depend on the operations being executed at any particular moment of time, we will have frequency components of di/dt at the clock frequency and also at subclock frequencies.

In addition to the problem of reducing power disturbances, i.e., of maintaining well defined voltage across the circuits, we also want to reduce the electromagnetic interference that's going to be generated primarily by higher harmonics of the clock frequency. As indicated above, current waveforms have the ability to excite many harmonics across the whole frequency band. Those harmonics higher than the frequency of the microprocessor, when conducted out through the power distribution system into the rest of the computer system (e.g., onto the motherboard and to the computer enclosure), can be effectively radiated by structures within the computer. To reduce the amount of radiation coming from the computer, it is desirable to block the higher harmonics from getting off the chip through the power distribution system by rolling off the harmonic conduction from the chip. Looking at the impedance out from the chip through the power distribution system, we want to have a high impedance for the higher harmonics so that they are substantially attenuated as they exit out from the chip through the power distribution system, through the package, through the card, and onto the motherboard.

Design of the power distribution system will typically include placement of decoupling structures and devices throughout power distribution system. In particular, a good power distribution design will affect layout of the chip including layout of the power distribution on the chip, the C4 and ball allocations to the power supply, package (or chip carrier) design including and the arrangement and attributes of layer defined therein, card design including selection and placement of discrete devices thereon (typically decoupling capacitors), connector design (e.g., where the card would be used to plug into a motherboard) and lastly, motherboard layout including regulator placement and selection and placement of discretes on the motherboard.

Figure 4A:
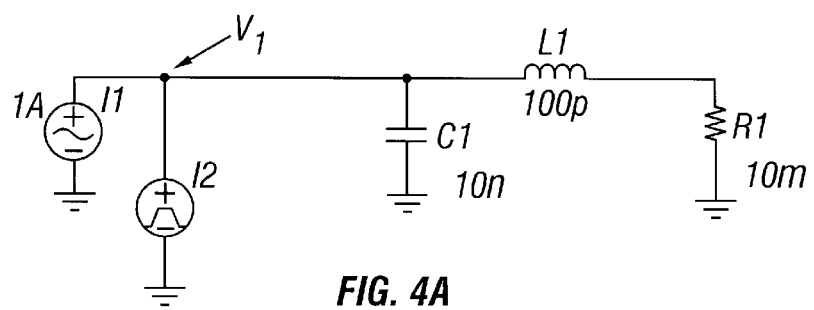
FIGS. 4A, 4B and 4C depict AC response and transient response for an exemplary model of a power distribution system that includes distribution inductance.
Figure 4B:
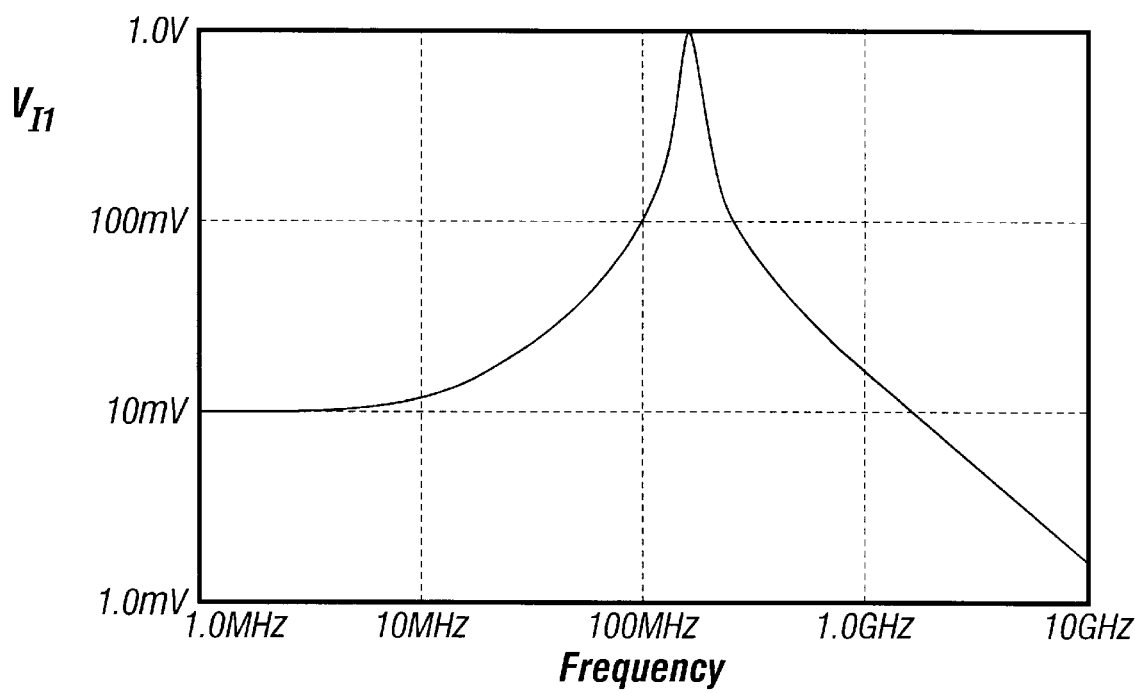
Figure 4C:
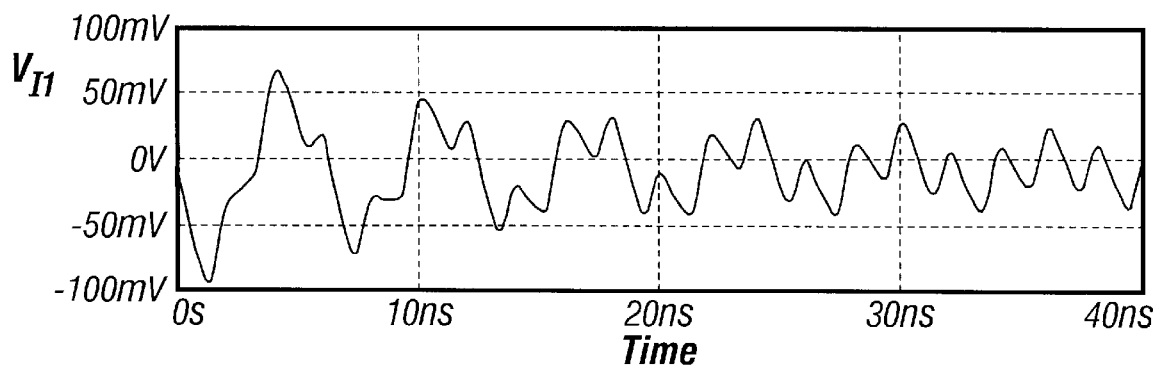

FIGS. 4A, 4B and 4C build on the very simple power distribution system previously described and add more realism with regard to actual system characteristics. In particular, FIG. 4A adds inductance, $L_1$, that represents the inductance of a package, card and motherboard. The $L_1$ inductance sits between the power supply regulator and the microprocessor circuits. The result is an RLC resonance circuit that resonates at a frequency $$\frac{1}{2\pi\sqrt{C_1 L_1}}.$$

So the AC response (see FIG. 4B) peaks up, in this particular case, between 100 an 200 MHz to a very high value of the order of 1 Ω. In contrast, we still have 10 mΩ at low frequencies (<1 MHz) from $R_1$. The transient response (see FIG. 4C) indicates, in this particular case, that we are exciting the circuit with a 500 MHz current draw. However, the 500 MHz variations in the voltage are superimposed on a much larger, lower frequency component that is excited as the circuit is turned on. The lower frequency component comes from the resonance peak of the power distribution system at 100–200 MHz. The lower frequency component is excited by the sudden turn-on of the switching source, $I_2$, at the beginning of the illustrated time scale (i.e., at T=0). Since the power distribution system is a resonant system, although we are exciting it at a frequency higher than its resonance frequency, the turn on, or turn off, of this higher frequency excitation, excites a resonance at the characteristic frequency of the circuit. In short, when we turn the circuit on (i.e., start our high frequency excitation), the circuit rings at its characteristic frequency, and similarly when we turn the circuit off (i.e., stop our high frequency excitation), the circuit rings at its characteristic frequency.

As a result, when we turn on our microprocessor or turn off our microprocessor, not only do we expect to see variations in the supply voltage due to the periodic nature of current draws at the microprocessor frequency, in this case at 500 MHz, but we also expect to see lower frequency components of current draw and related variations in the supply voltage associated with resonance(s) of the power distribution system. Given the effect of such resonance, we now consider what can be done to reduce the peak(s) of such resonance in the power distribution system.

FIG. 5B adds detail to the circuit model of the power distribution system. In particular, FIG. 5B depicts impedance, $R_2$, associated with the capacitance, $C_1$, on-chip or on-die (e.g., that associated with the microprocessor circuits) and, in addition, depicts losses in the power distribution system, e.g., an impedance, $R_3$, of 10 mΩ in series with $R_1$. In addition, we not only consider voltage $V_1$ at the chip (i.e., at the junction of $C_1$ and $L_1$) but also the voltage, $V_2$, which would be excited at the motherboard (i.e., at the junction of $R_3$ and $R_1$). Using 10 A as the amplitude of the current, we see an AC response as shown in FIG. 5A. In particular, we see that the disturbance on-chip peaks up to about 1 Ω (i.e., 10 Volts/10 Amps) at 30 MHz, and that the disturbance reaching the motherboard also peaks up to about 100 mΩ at the same frequency. The disturbances reaching the motherboard fall off more rapidly than they do on-chip or on-die. So, at 500 MHz, the amplitude of the AC response is well below 0.1 mΩ at the motherboard, whereas on the die it would still be at about 10 mΩ according to this particular simulation.

FIGS. 6C and 6B depict the transient response and the AC response of the power distribution system. In this particular case, inductance, $L_1$, between the regulator and the chip is varied. The resonant frequency starts out at somewhere in the region of 400 MHz, drops to 100 MHz, and then subsequently drops to about 35 MHz, for increasing values of $L_1$ inductance. In FIG. 6C, waveforms 610, 620 and 630 depict the transient response of on-chip power supply voltage, whereas remaining unlabelled waveforms depict the transient response of at-regulator power supply voltage. Focusing on the transient response, we see that with the lowest inductance (100 pH), we have a waveform 630 that consists primarily of the 500 MHz sawtooth. In this case, the mid-frequency peak is small and washed out so we see negligible effect on the transient response. However, when we increase the inductance and, as a result, peak our resonance at about 100 MHz, then we see an initial transient which dies away (see waveform 620). In the case of this higher inductance value for $L_1$ (300 pH), the initial transient is about 50 mV in magnitude and the on-chip power supply voltage waveform 620 includes the 500 MHz sawtooth superimposed upon this initial transient. When inductance is further increased to the largest value of $L_1$ (1000 pH), and as a result the resonant frequency drops to somewhere around 35 MHz, we see the large amplitude slow wave (see waveform 610) generated by turn-on (at T=0) of the 500 MHz AC current source and excitation of the resonance. As before, the 500 MHz sawtooth is superimposed upon the resonance waveform. However, in this case, the magnitude of the on-chip power supply voltage waveform transient is approximately 150 mV. FIGS. 6A, 6B, and 6C illustrate an important resonance challenge for power distribution system design. Although we have described the turn-on transient response, it will be understood that turn-off transient response presents similar issues, albeit with an initial voltage overshoot.

Figure 7A:
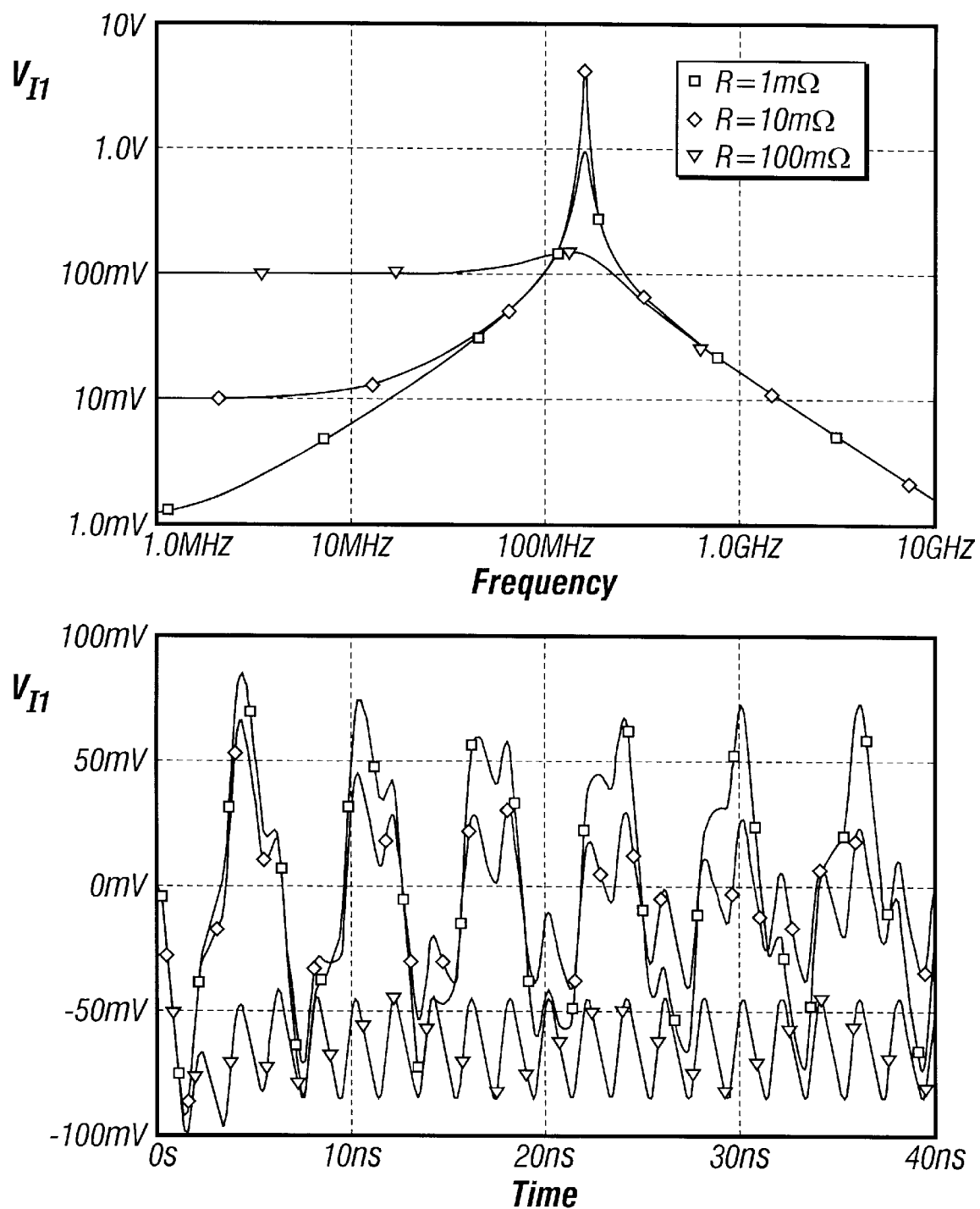
FIGS. 7A and 7B further illustrate (in time and frequency domains, respectively) effects on mid-frequency resonances in a power distribution system given varying power distribution system parameters.
Figure 7B:
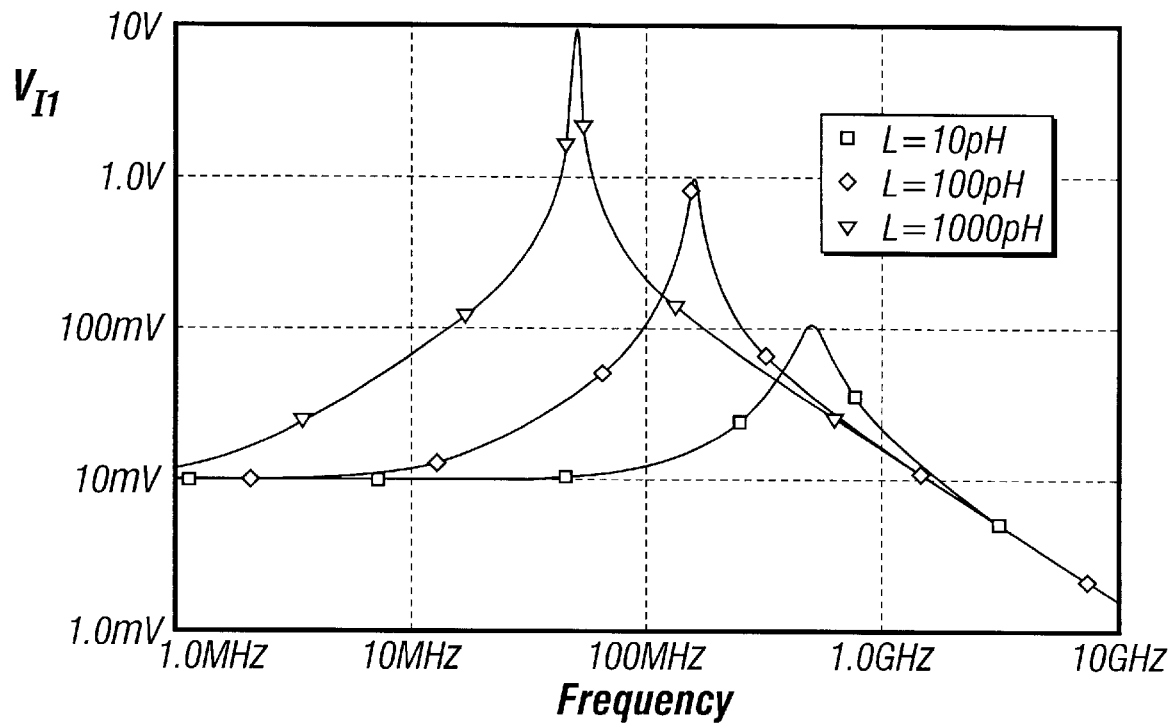
Figure 7B:
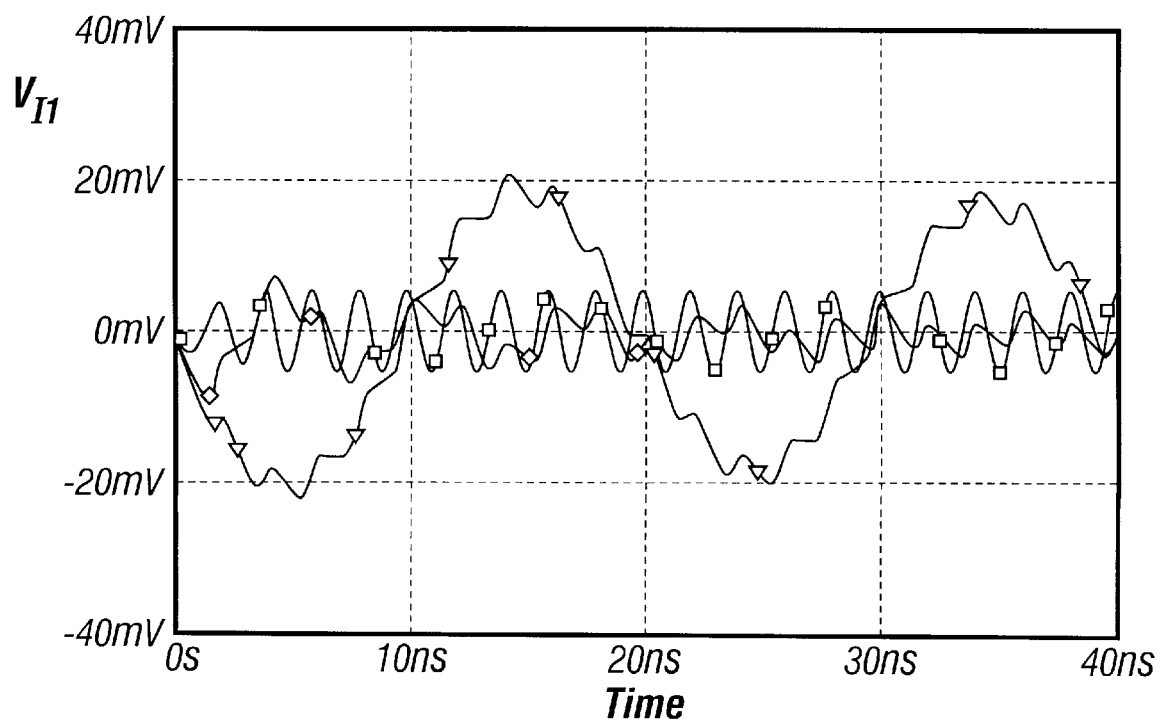

FIGS. 7A and 7B show a similar set of AC and transient response pairs. In FIG. 7B, the AC response and transient response are shown for supply inductances of 10, 100 and 1000 pH. In FIG. 7A, we illustrate the effect of varying the regulator slope resistance ($R_1$) from 1 mΩ, to 10 mΩ, to 100 mΩ. A resistance of 100 mΩ is very desirable from the point of view of resonance peak damping. However, the penalty at lower frequencies includes a 100 mΩ offset (which in this case corresponds to a 100 mV on-chip power supply voltage offset), rather than an offset on the order of 1 mΩ or 5 mΩ. So, although we have removed the large transient response, it is replaced by a substantial DC offset for any substantial current being drawn by the microprocessor. Although such an approach may be a solution in the classic sense of how to deal with a series RLC circuit and critically damping an resonance, it is not a good option here, because of the large DC voltage difference between the regulator and the chip.

Figure 8A:
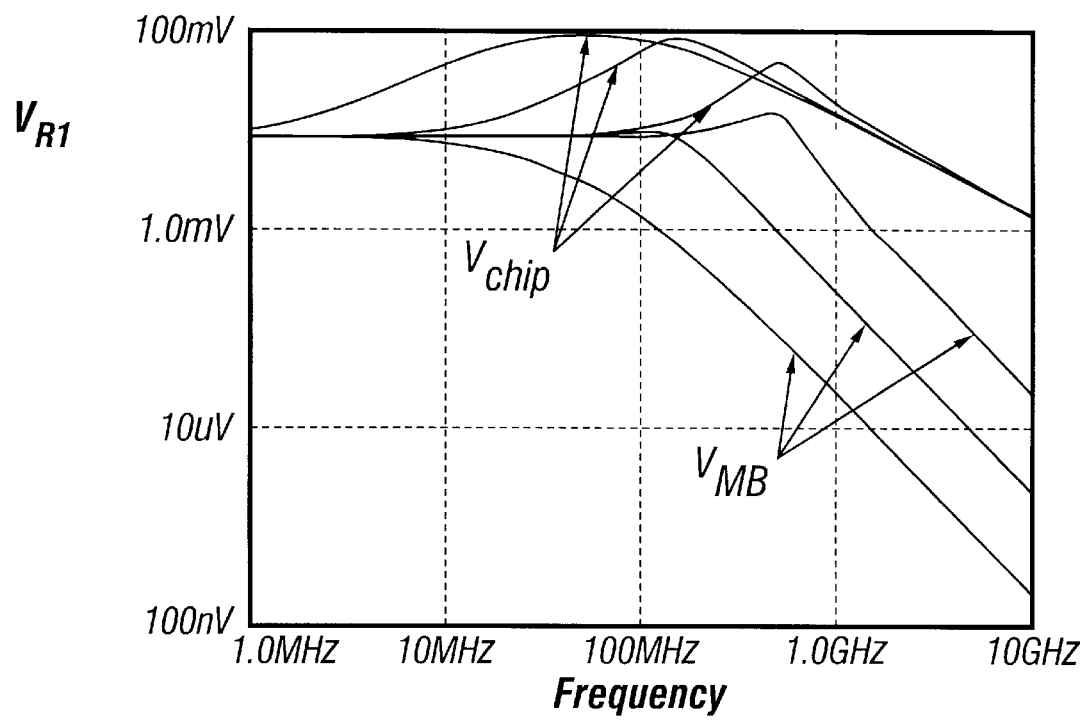
FIG. 8 illustrates how high-frequency components can reach the motherboard (MB) and potentially contribute to ElectroMagnetic Interference (EMI) effects related to power distribution system design.
Figure 8B:
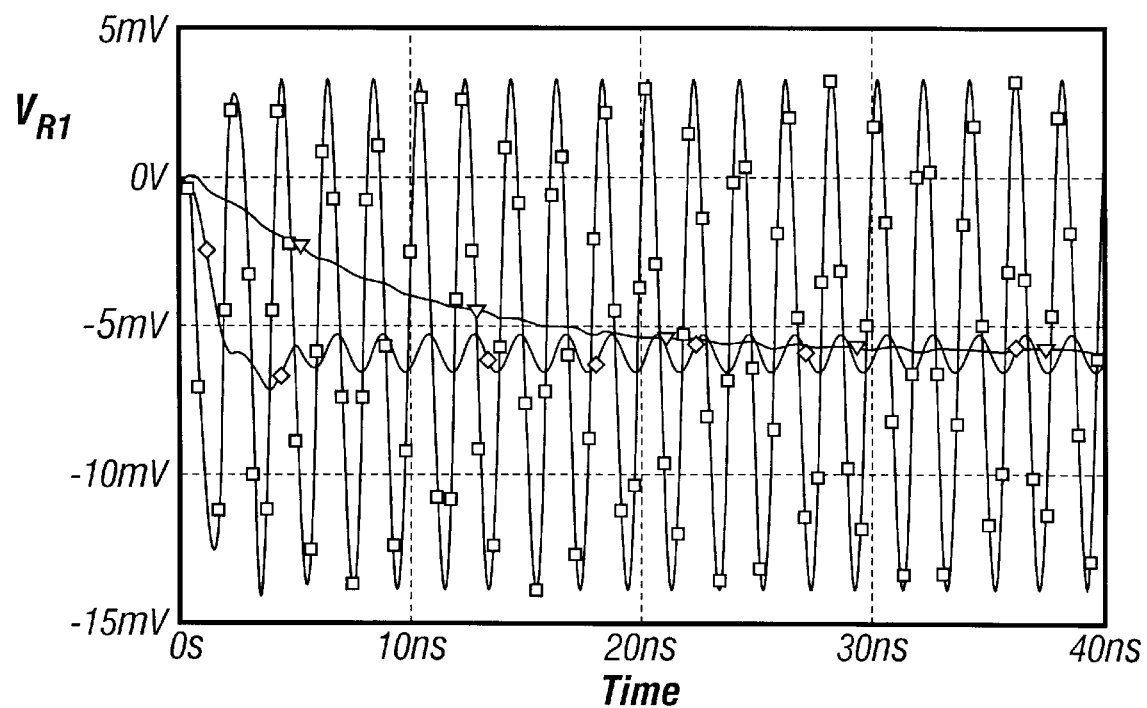

FIG. 8 further illustrates the challenge of trying to block high frequency harmonics getting out to the motherboard. Again, using three different inductance values for the circuit from the regulator to the chip, we see the power supply voltage on-chip as the three upper waveforms of the AC response peaking at approximately 100 mV. But in addition, FIG. 8 shows, in the 3 lower curves, the AC response of the disturbance as it reaches the regulator on the motherboard. With the lowest inductance between the chip and the regulator, we get the largest response at high frequencies, for example 1 mV at 1 GHz. Because of the low inductance between the chip and the regulator, we have little impedance to high harmonics and get a large response on the motherboard with a low inductance at the power distribution system. If, on the other hand, we were to increase the inductance as shown by the other two curves, the lowest curve now is down by two (2) orders of magnitude to approximately 10 µV at 1 GHz.

So what we would like to do on the power distribution system from the perspective of voltage delivered to the microprocessor, is minimize the inductance of the power distribution system between the regulator and the chip. However, from the point of view of blocking the high harmonics getting out from the chip to the motherboard, our objectives drive us in the opposite direction. In general, we would like to have a high inductance to block those harmonics, but the high inductance moves the resonance of the power distribution system down to the 10 MHz range and leads to the transient response problem previously illustrated.

Figure 9:
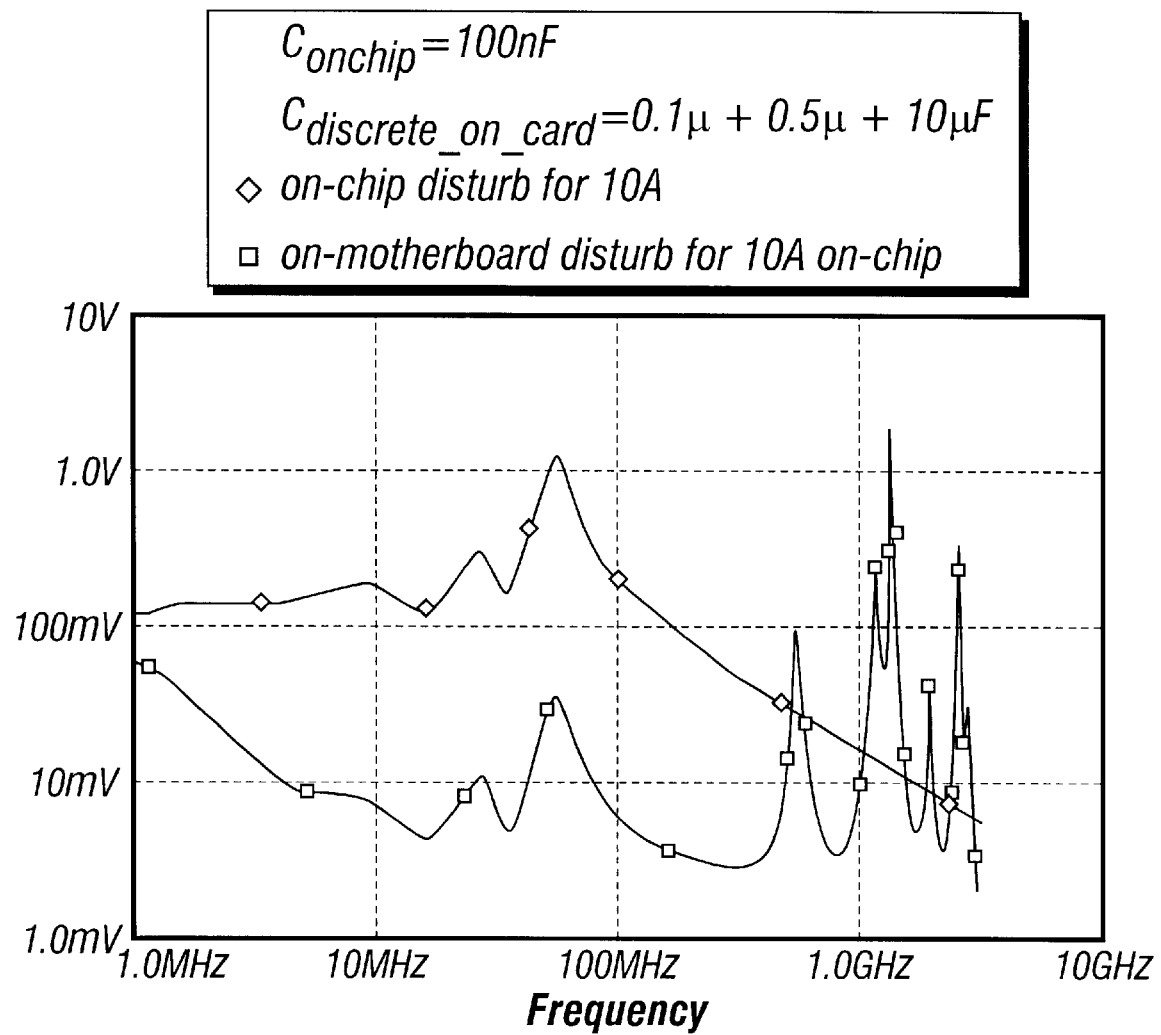
FIG. 9 depicts AC responses for an exemplary power distribution system including decoupling capacitance to reduce mid-frequency resonances and further illustrates peaks of high energy transfer to the motherboard.

FIG. 9 illustrates a typical AC response for a more realistic system design including a die, package, card, and motherboard and illustrates what can be achieved through circuit component value choices. Once again two curves are shown. The upper curve is the voltage as seen at the chip and the lower curve is the voltage as seen at the motherboard. In this particular case, a 10 A AC current is used, so 100 mV corresponds to 10 mΩ. At the chip, we see the peak response is approximately 1 V at 60 MHz, which corresponds to 100 mΩ, and then it falls off rapidly for frequencies above 100 MHz. On the other hand, the voltage induced at the motherboard is a little over an order of magnitude lower than that on-chip, peaking up to about 30 mV (or 3 mΩ) at 60 MHz, then falling off.

With this design, we are approaching the limits of the conventional design practice of distributing decoupling capacitors throughout the power distribution system. Current surge (particularly at mid-frequencies) is a problem which will grow in significance as supply voltages decrease from 2 V to 1.5 V and lower and as operating frequency, current requirements and power dissipation increase for integrated circuit chips (e.g., high performance microprocessors). New solutions are needed.

Surge Current Management and Feedback Control

Figure 10A:
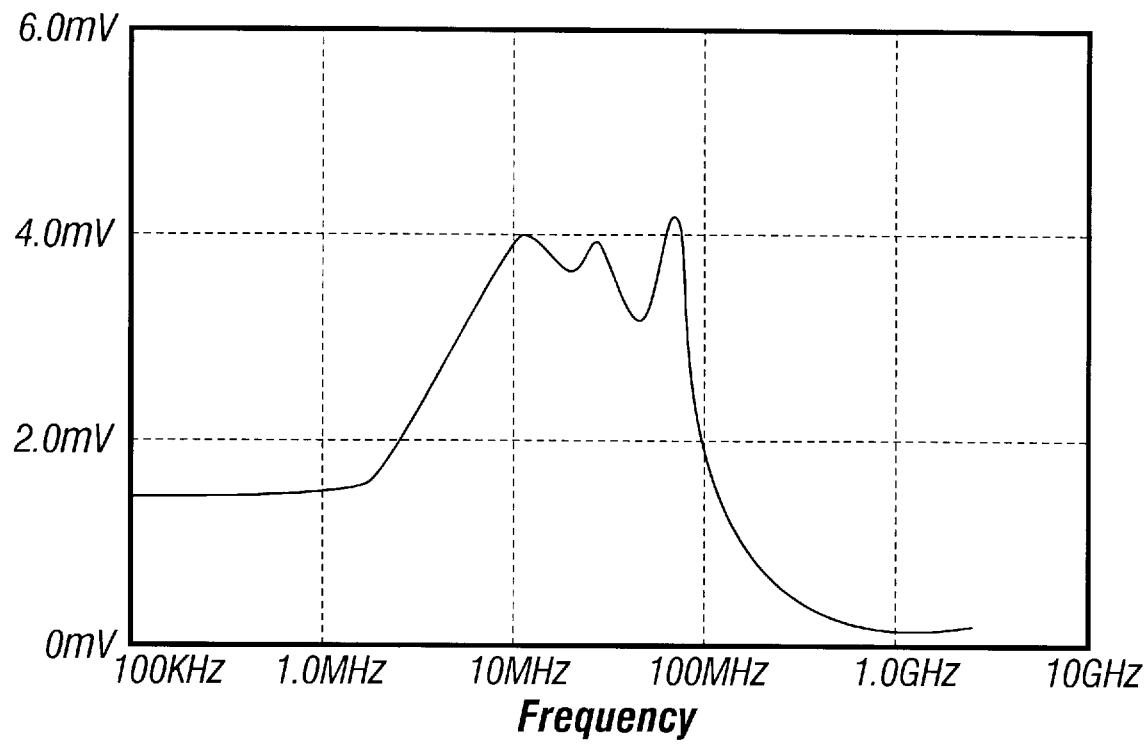
FIG. 10A depicts an AC response of an exemplary power distribution system including decoupling capacitance to reduce mid-frequency resonances.
Figure 10B:
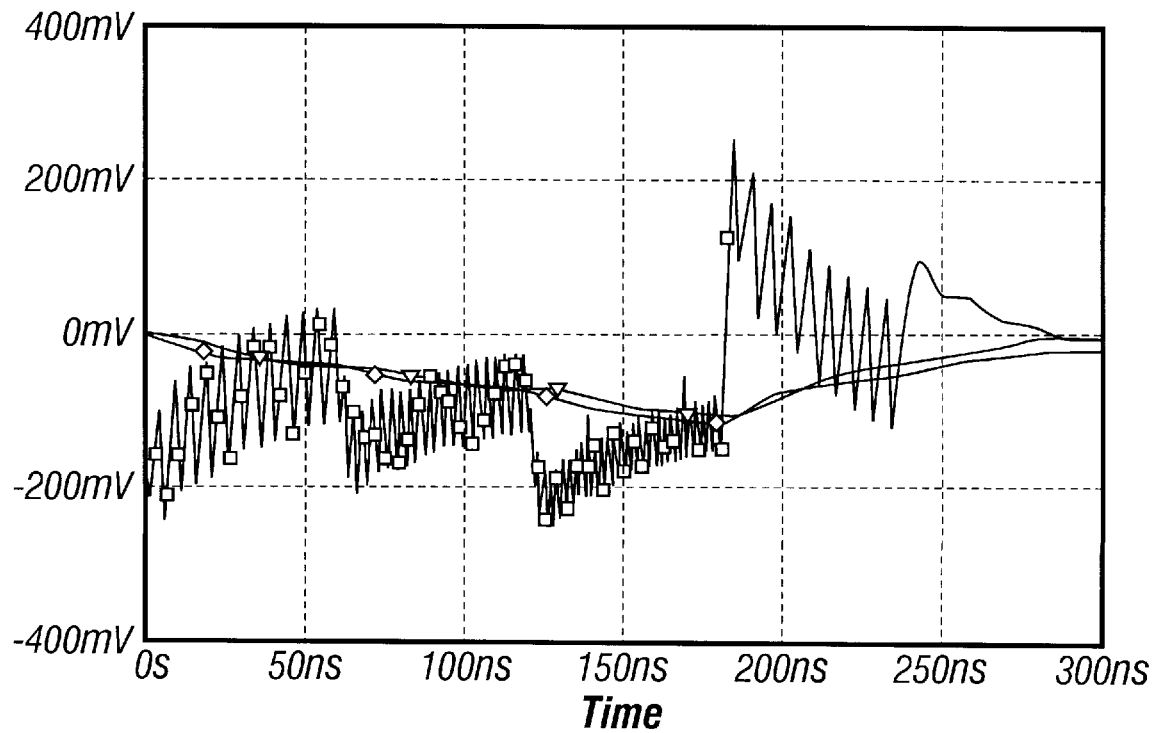
FIG. 10B depicts a transient response of an exemplary power distribution system with AC response as depicted in FIG. 10A.

FIGS. 10A and 10B illustrate an approach for reducing the magnitude of disturbances to on-chip power supply voltage otherwise resulting from the surging of current demanded by an integrated circuit, e.g., a microprocessor, during a transition between start and stop. FIG. 10A depicts an AC response of the power distribution system showing a peak of 40 mΩ, i.e., 40 mV at 1 A. The peak has been chopped down or leveled off to 40 mV through circuit design techniques discussed above. Such a resonance peak could be well above 1 Ω, maybe as high as 10 Ω, in the frequency range from 10 MHz to 100 MHz before the circuit design techniques are exploited. However, FIG. 10A illustrates an AC response flattened down to 40 mV over the frequency range from 10 MHz to 100 MHz. The resonance peak has been flattened using decoupling capacitors placed throughout the power distribution system between the chip and the regulator.

Even after judicious placement of decoupling capacitors, the impedance between 10–100 MHz (approximately 40 mΩ) is still much higher than the impedance at a peak operating frequency of 500 MHz, where the impedance is approximately 2–3 mΩ. As a result, and as illustrated above with reference to FIGS. 8 and 9, current surges associated with the turning on and turning off a microprocessor that runs at a nominal operating frequency of 500 MHz will tend to excite the resonance peak (or peaks) between 10–100 MHz. Because of the higher mid-frequency impedance (approximately 40 mΩ vs. approximately 2–3 mΩ), the transient response includes voltage under- and over-shoots associated with turn-on and turn-off.

FIG. 10B illustrates the impact of a staged increase in operating frequency on this transient response. In particular, at time T=0, the microprocessor is turned on, but rather than transitioning immediately from a stop clock condition to full nominal operating frequency (e.g., 500 MHz), the microprocessor steps up to a lower initial frequency, e.g., 200 MHz. As a result, power supply voltage exhibits a transient of about 200 mV with a superimposed AC amplitude that would be evoked for a point on the AC response at 200 MHz. In the illustration of FIG. 10B, the amplitude of mid-frequency components (e.g., in this case, components between about 10 and 100 MHz) of current is reduced sufficiently that voltage undershoot (or sag) is limited to approximately 10% of a nominal 2 V on-chip power supply voltage.

After the initial transient has died away after about 60 ns, the clock is stepped up to about 300 MHz. Again, a current surge induced transient is generated because average current drawn by the microprocessor has increased as a consequence of going from 200 MHz to 300 MHz and the resulting current surge has frequency components in the increased impedance portions of the AC response. However, as before, the amplitude of these mid-frequency components of surge current has been limited by the incremental step in operating frequency. The second transient again dies away. FIG. 10B illustrates the AC response at 300 MHz superimposed upon the second transient through about 120 ns. The amplitude of the AC response is lower at 300 MHz than at 200 MHz as shown in the impedance curve (FIG. 10A) falling away between 200 and 300 MHz. At approximately 120 ns, the microprocessor operating frequency is increased to 500 MHz, resulting in a third transient. This third transient has an amplitude of approximately 200 mV and, as before, has the AC response at the operating frequency (now 500 MHz) superimposed.

By chirping the clock, i.e., by going from approximately 0 MHz, to 200 MHz, to 300 MHz, and then finally to 500 MHz, surge current induced power supply voltage undershoot (or sag) is limited. By ratcheting up operating frequency, rather than transitioning all at once, mid-frequency components of current surge and the associated mid-frequency IR drop are reduced. In particular, the approach depicted in FIG. 10B exhibits a dV/V of less than approximately 0.1, given an on-chip power supply voltage of 2 V.

FIG. 10B also illustrates, beginning at 180 ns, a complementary approach for managing dV/V during microprocessor turn-off, e.g., during transition to a snooze or stop-clock state from high frequency operation. As before, the transition is not made in a single step. Instead, operating frequency is stepped down to 200 MHz (e.g., at 180 ns). The result is a positive voltage transient. As shown in FIG. 10B, on-chip power supply voltage overshoots to approximately 200 mV (positive) from an undershoot of over 100 mV (negative). This transient dies away and then finally at about 240 ns, the microprocessor clock is stopped (or reduced to an extremely low frequency). A positive transient is generated and eventually dies away leaving a voltage disturbance of essentially zero volts. In other words, on-chip power supply voltage returns to the quiescent voltage (e.g., 2 V).

Clock chirping is one technique that can be used to manage dV/V associated with current surges. Once the peak in the AC response has been reduced as much as possible by reducing inductance and/or distributing capacitance throughout the power distribution system, such techniques will need to be employed to manage surge currents in low voltage, high current, high frequency integrated circuits. Although FIG. 10B illustrates the effect of gradually starting and gradually stopping the microprocessor, it will be appreciated more generally that changes in operating frequency of an integrated circuit result in frequency components of surge current that can correspond to mid-frequency peaks in the AC response of a power distribution system, and that reductions in these frequency components can be achieved by controlling operating frequency, thereby reducing power supply voltage disturbances.

FIG. 10B is illustrative of the reduced surge currents and the related reduced disturbance in power supply voltage provided by a staged transition in operating frequency. While such an approach can be employed open-loop, e.g., as part of a microprogrammed clock frequency transition, a potentially much more powerful technique involves closed-loop control. While a transition to, or from, a stop clock or sleep mode is typically commanded and can therefore be executed by chirping the clock frequency (open-loop) in a way which reduces surge currents, other surge current induced disturbances result from uncommanded changes in integrated circuit operations not amenable to open-loop control.

For example, although surge currents were described above with reference to transient responses to turn-on, or turn-off, of a microprocessor, it will be recognized that temporal variations in current demand may be triggered not only by changes in operating frequency, but also by temporal variations in the operations being performed by the microprocessor. For example, instruction sequences and corresponding circuit behaviors may contribute to mid-frequency components of current demand. Such instruction sequence derived components may be cyclic or episodic. For example, a loop which includes a short sequence of floating point operations within a larger set of integer operations may alternately cause circuits associated with a floating point unit to be active, then idle, then active, etc. Such variations in current demand can have a significant impact on dV/V as power supply voltages decrease, operating frequencies increase, and current levels increase in high performance integrated circuits.

Therefore, a feedback control approach is now described in which onset of surge currents (positive or negative) is detected and mitigated by performing (closed-loop) a control action. One such control action includes variation in integrated circuit operating frequency from a nominal operating frequency to reduce mid-frequency components of current surge. Another control action includes varying an amount of current passed via a current dump circuit path to reduce mid-frequency components of current surge. An exemplary of current dump circuit path includes a variable resistance path between power supply voltage nodes. By controllably varying the resistance, and therefore the dumped current, a feedback controller can reduce mid-frequency components of current surge.

Although such a current dump circuit path would not typically perform useful computational work, embodiments are envisioned (and, based on the description herein, will be appreciated by those of skill in the art) in which at least some useful function, beyond surge current management, is performed. For example, one way to use the "dumped" or diverted current is to make it part of the design. On such design includes multiple (e.g., dual) implementations of at least a subset of circuit functions. These multiple implementations each can have differing power requirements. Then, a particular implementation is chosen depending on the current demand to reduce mid-frequency components of current surge. A variation on this approach includes automatically balancing some components of current surge, e.g., data dependent components, by use of a true and complement-design in which increased current demand of one circuit (e.g., the true version) is offset by decreased current demand of the other (e.g., the complement version).

Figure 11:
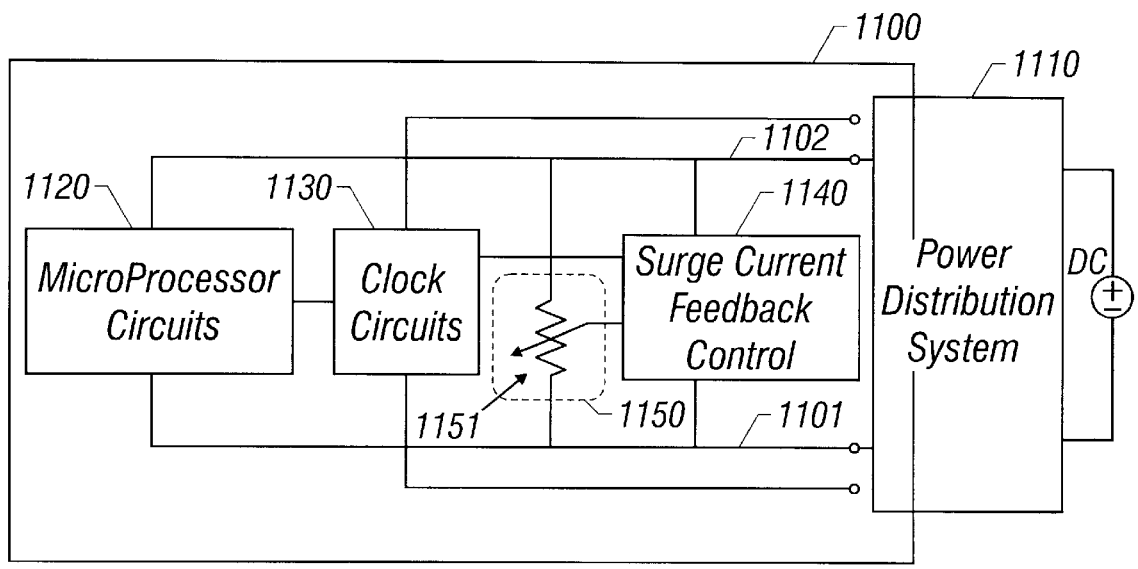
FIG. 11 depicts a surge current feedback control arrangement in accordance with an embodiment of the present invention.

FIG. 11 depicts an exemplary integrated circuit chip 1100 including feedback control circuitry 1140 for controlling mid-frequency components of current demand and thereby regulating power supply voltage disturbances to within design tolerances. In the exemplary embodiment, microprocessor circuits 1140 include a substantial majority of the circuits defined on integrated circuit chip 1100 and, as such, are the dominant source of time varying current demands. In particular, microprocessor circuits 1120 exhibit both episodic and cyclic variations in circuit activity patterns which can translate into temporal variations in current demand. As described above with respect to the impedance analysis, when these temporal variations include mid-frequency components corresponding to portions of the AC response (of power distribution system 1110) exhibiting increased impedance, disturbances in the on-chip power supply voltage can result. The AC impedance characteristic of FIG. 10A is representative of power distribution system 1110. Because integrated circuit chip 1100 operates at low voltages and high currents, mid-frequency components of current may result in significant power supply voltage overshoots or undershoots due to the increased impedance of power distribution system 1110 at those mid-frequencies.

Typically, clock circuits 1130 are provided with a separate power supply source (as shown) to ensure an extremely stable power supply thereto. Other embodiments are possible.

In the embodiment of FIG. 11, feedback control circuitry 1140 is connected between power supply voltage nodes 1102 and 1103 to sense power supply voltage therebetween and to initiate control responses to reduce mid-frequency components of current demand and regulate the power supply voltage to within design tolerances. In the embodiment shown, feedback control circuitry 1140 controls a current dump path 1150 (illustrated as variable resistance circuit 1151) for passing current from power supply node 1102 to power supply node 1101. By passing at least some current under quiescent conditions and varying (i.e., increasing or decreasing) current flow through current dump path a 1150 under feedback control, mid-frequency components of current are reduced.

Similarly, in the exemplary embodiment of FIG. 11, feedback control circuitry 1140 controls the frequency of a clock signal supplied to microprocessor circuits 1120 by clock circuits 1130. Because of the temporal characteristics of current draw in typical CMOS circuits (recall FIG. 2A), average current drawn at high frequencies is greater than that at lower frequencies. As a result, variations in frequency of the clock signal supplied to microprocessor circuits 1120 result in variations in current demand. As before, frequency components of current surge corresponding to increased impedance (see e.g., AC response of FIG. 10A), can be reduced. For example, episodic variations in current demand can be at least partially offset by controlled variations operating frequency, thereby reducing power supply voltage undershoot or overshoot.

Although FIG. 11 depicts an embodiment in which feedback control circuitry 1140 performs either clock frequency variations or a variable current pass (or both) to reduce mid-frequency components of power supply current, other embodiments may employ one control action or the other. Still other embodiments employ any other suitable current affecting control action, alone or in combination with either, or both, of the above-described control actions. In each such embodiment, the control action (e.g., current dump or frequency variation) need not fully offset a current surge (increase or decrease). Instead, the control action need only reduce the problematic mid-frequency components of current surge sufficiently to regulate on-chip power supply voltage to within an envelope suitable for reliable device and circuit operations.

For example, though an instruction sequence induced change in microprocessor circuits active (and hence current demanded) may generate an unacceptable transient in on-chip power supply voltage, the control response by feedback control circuitry 1140 need only alter the current demand so as to limit the mid-frequency components thereof. Typically, feedback control circuitry 1140 "smooths" variations in current demand to shift sub-clock frequency components of current demand to below the increased impedance portion of AC response for power distribution system 1110. However, feedback control circuitry 1140 could alternatively accentuate variations in current demand to shift mid-frequency components higher so as to avoid the increased impedance portion of AC response for power distribution system 1110.

Although aspects of the present invention are described herein in terms of shifting mid-frequency components of current demand to lower (or higher) frequencies to avoid increased impedance portions of the AC response for power distribution system 1110. It will be appreciated that aspects of the present invention may also be understood as reducing (using feedback control circuitry 1140) the amplitude of surge current and thereby reducing the amplitude of resultant excitations of mid-frequency resonances.

In general, the control law implemented by feedback control circuitry 1140 will be determined by the AC response of a particular power distribution system, by the transient response and magnitude of available control actions, and by the ability to sense onset of voltage disturbances. Sensing may include averaging over a temporal interval and may utilize voltage or current measure devices or structures. As described above, feedback control circuitry 1140 need not regulate power supply current level. Indeed, power supply current may vary from maximum to minimum values as long as the frequency components of such variation are outside (i.e., higher or lower than) the increased impedance portion of AC response for power distribution system 1110. Feedback control circuitry 1140 regulates on-chip power supply voltage by reducing mid-frequency components of power supply current. Control system design techniques are well known in the art and feedback control circuitry 1140 is of any suitable design, including linear and nonlinear design, and employing proportional, integral, and/or derivative control action.

In the embodiment of FIG. 11, current dump path 1150 includes a variable resistance circuit 1151 for passing current from power supply node 1102 to power supply node 1101 under control of feedback control circuitry 1140. Current dump path 1150 is any variable resistance path, including, for example, an array of pass gates, a multiple tap integrated (e.g., poly-silicon) resistor, or any combination of the foregoing. Preferably, current dump path 1150 passes a quiescent current so that both positive and negative control actions are available to feedback control circuitry 1140. Although the electrical characteristics of current dump path 1150 depend on the AC response of a particular power distribution system, the expected spectral characteristics of current surge, and the availability and efficacy of additional control actions (e.g., clock frequency control), it is expected that some embodiments pass currents on the order of 10 A (quiescent) with controlled current dumps of 0–20 A.

Figure 12:
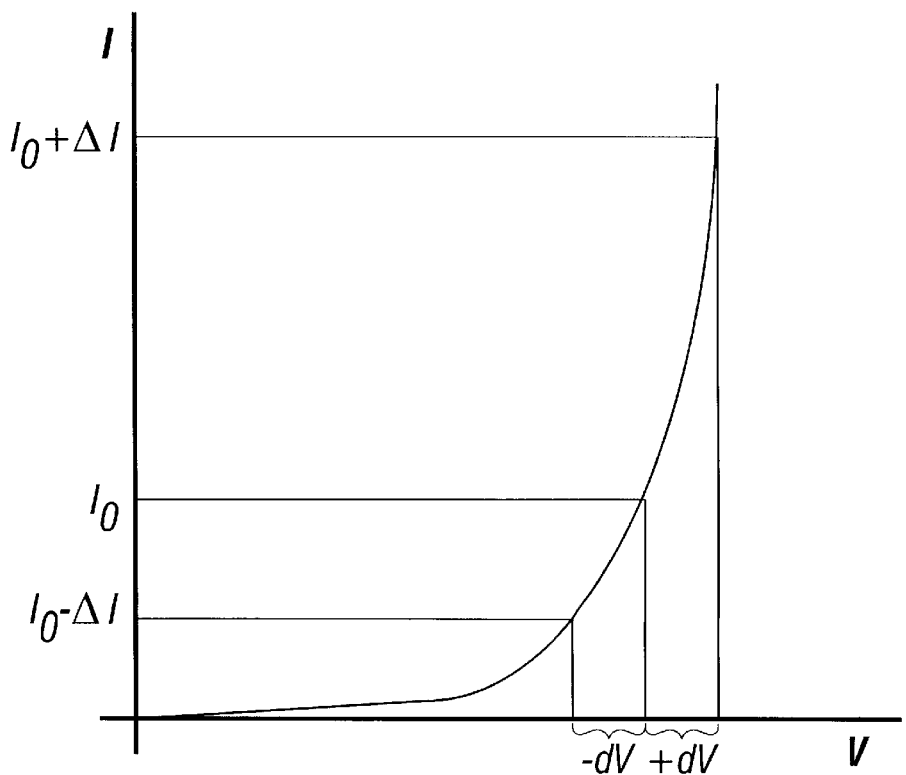
FIG. 12 depicts a current voltage (IV) characteristic for an exemplary non-linear resistor (NLR) in accordance with an embodiment of the present invention.

Alternative embodiments may combine aspects of the feedback control circuitry 1140 and current dump path 1150. For example, aspects of feedback control circuitry 1140 and current dump path 1150 can be at least partially embodied in a single electrical component, e.g., a non-linear resistor (NLR). FIG. 12 depicts a current voltage (IV) characteristic for an exemplary NLR. As power supply voltage increases (+dV), more current ($I_0+\Delta I$) is dumped. Similarly, as power supply voltage decreases (−dV), less current ($I_0-\Delta I$) is dumped. For non-linear IV characteristics such as that shown, the result is negative feedback on power supply voltage excursions. For example, when a current surge is demanded (e.g., by microprocessor circuits 1120), power supply voltage will have a tendency to drop (dV is negative), resistance of the NLR increases, and current passed through the NLR is reduced thereby making more current available to satisfy the surge demanded. Similarly, when current demanded by microprocessor circuits 1120 falls off, power supply voltage will have a tendency to increase (dV is positive). However, in this case, resistance of the NLR decreases and increased current is passed through the NLR, thereby dumping more current. Based on the description herein, a variety of suitable NLR devices will be apparent to those of skill in the art. Like feedback control circuitry 1140 (described above) the particular electrical characteristics of the NLR (including the nature of the non-linearity thereof) will depend on the AC response of a particular power distribution system, the expected spectral characteristics of current surge, and the availability and efficacy of additional control actions. In some embodiments an NLR may be combined with other feedback mechanisms described herein.

Clock circuits 1130 are of any suitable variable frequency design. Because of the current demand characteristics of typical CMOS circuits (recall FIG. 2A), average current demanded at higher frequencies is greater than at lower frequencies. Variations in clock frequency may be continuous (if compatible with bus clocking and other timing constraints) or stepped. Some embodiments employ frequency multiplier or divider techniques to define a set of frequency variations (e.g., . . . ¼×, ½×, ×; or ×, 2×, 4×, . . . ; or ×, 2×, 3×, 4×, . . . ; etc.). In other embodiments, clock circuits 1130 may simply mask clock pulses supplied to microprocessor circuits 1120 (e.g., every Nth clock pulse) so as to reduce the average number of clock cycles per interval and thereby reduce average current. As with current dump path 1150, clock circuits a 1130 preferably operated at a quiescent level so that both positive and negative control actions are available to feedback control circuitry 1140. For example, clock circuits 1130 may operate quiescently at a frequency (or average apparent frequency) below a peak frequency for microprocessor circuits 1420.

As described above, temporal variations in current draw of microprocessor circuits 1120 can result from episodic or cyclic variations in circuit activity patterns, as a result of instruction sequence, or conceivably as a result of data dependent circuit activity. In addition, commanded changes in operating frequency can have a substantial effect on current surge (as illustrated above with respect to the impedance analysis). In the case of commanded changes in operating frequency, feedback control circuitry 1140 operates to limit mid-frequency components of current demand by either controllably limiting actual operating frequency changes, for example, by graduated (or gradual) changes in actual operating frequency toward a commanded target frequency (e.g., sleep or stop clock), by mid-frequency surge current offsetting current dumps, or by combinations of these and/or other suitable control responses.

While the invention has been described with reference to various embodiments, it will be understood that these embodiments are illustrative and that the scope of the invention is not limited to them. Many variations, modifications, additions, and improvements of the embodiments described are possible. For example, additional or alternative control actions may be employed to reduce mid-frequency components of current surge. Furthermore, although the description has emphasized illustrative microprocessor embodiments, a wide variety of other integrated circuits may utilize. Although surge current management facilities have been described in one embodiment as on-chip, other embodiments may sense onset of power supply voltage disturbances and/or perform at least control partial control actions off-chip. In general however, sensing and performance of control actions should be in close electrical proximity to (i.e., small RLC from) microprocessor circuits or other major current draws. Structures and functionality presented generally as hardware in the exemplary embodiments may be implemented as digital or analog circuits, or as software, firmware, or microcode in alternative embodiments. These and other variations, modifications, additions, and improvements may fall within the scope of the invention as defined in the claims which follow.

What is claimed is:

1. A method for reducing current surge induced disturbances in a power supply voltage delivered to an integrated circuit by a power distribution system, said method comprising:

sensing said power supply voltage delivered at said integrated circuit; and in closed-loop response to said sensing, performing a control action to regulate said power supply voltage to within a predetermined dV/V characteristic, said control action being selected to reduce a sub-nominal operating frequency component of current drawn by said integrated circuit, said power distribution system exhibiting increased AC impedance at said sub-nominal operating frequency.

2. A method, as recited in claim 1, further comprising passing current through a current dump circuit substantially unrelated to functional characteristics of said integrated circuit but providing a controllable component of current drawn by said integrated circuit;

wherein said control action includes controllably varying said passed current in response to a sensed onset of a disturbances in said power supply voltage.

3. A method, as recited in claim 1, wherein said control action includes passing current through a current dump circuit in response to a sensed onset of overshoot in said power supply voltage.

4. A method, as recited in claim 1, further comprising passing current through a current dump circuit, and wherein said control action includes reducing said current discharged through said current dump circuit in response to a sensed onset of an undershoot in said power supply voltage.

5. A method, as recited in claim 1, wherein said control action includes controllably varying an actual operating frequency of at least a substantial portion of circuits defined on said integrated circuit in response to a sensed onset of a disturbance in said power supply voltage.

6. A method, as recited in claim 1, wherein said control action includes increasing an actual operating frequency of at least a substantial portion of circuits defined on said integrated circuit in response to a sensed onset of an overshoot in said power supply voltage.

7. A method, as recited in claim 1, wherein said control action includes reducing an actual operating frequency of at least a substantial portion of circuits defined on said integrated circuit in response to a sensed onset of an undershoot in said power supply voltage.

8. A method, as recited in claim 1, wherein said sub-nominal operating frequency component reduced by said control action otherwise results from one of:

substantially instantaneous changes in operating frequency of said integrated circuit;

instruction sequence dependent variations in circuit activity on said integrated circuit, said integrated circuit including a microprocessor; and temporal variations in circuit activity on said integrated circuit.

9. A method, as recited in claim 1,
wherein said integrated circuit includes a microprocessor; and
wherein said sub-nominal operating frequency component reduced by said control action otherwise results from instruction sequence dependent variations in circuit activity on said integrated circuit, said instruction sequence dependent variations being either cyclic or episodic.

10. A method, as recited in claim 1,
wherein said current drawn by said integrated circuit generally increases with increasing operating frequency thereof;
wherein said current drawn by said integrated circuit generally decreases with decreasing operating frequency thereof;
wherein a target operating frequency of at least a substantial portion of circuits defined on said integrated circuit is changeable in response to a change clock frequency directive;
wherein a substantially instantaneous change in said target operating frequency generates said sub-nominal operating frequency component of current drawn by said integrated circuit, said power distribution system exhibiting increased AC impedance at said sub-nominal operating frequency; and
wherein said control action performed in said closed-loop response to said sensing substantially reduces said sub-nominal operating frequency component of current drawn thereby regulating said power supply voltage to within said predetermined dV/V characteristic.

11. A method, as recited in claim 10,
wherein said control action includes controllably varying current passed through a current dump circuit.

12. A method, as recited in claim 10,
wherein said control action includes controllably varying an actual operating frequency of at least a substantial portion of circuits defined on said integrated circuit.

13. A method, as recited in claim 10,
wherein said control action includes controllably selecting one of a high current instance of circuitry for performing a function and a low current instance for performing said same function.

14. A method, as recited in claim 10,
wherein said sensing and said performing a control action to regulate said power supply voltage are at least at least partially performed by a non-linear resistor (NLR).

15. A method, as recited in claim 1, further comprising:
operating said at least substantial portion of circuits of said integrated circuit at an actual operating frequency approaching a desired operating frequency but varied therefrom to regulate said power supply voltage to within said predetermined dV/V characteristic.

16. A method, as recited in claim 1,
wherein said sensing includes sensing of either or both of instantaneous power supply voltage and average power supply voltage over a temporal interval.

17. A method, as recited in claim 1,
wherein said sensing includes sensing of a representative current to determine said power supply voltage.

18. A method, as recited in claim 1,
wherein said predetermined dV/V characteristic is ±10% of a nominal power supply voltage.

19. A method, as recited in claim 1,
wherein said predetermined dV/V characteristic defines an acceptable power supply voltage level envelope around a nominal power supply voltage wherein different magnitudes of positive and negative voltage excursion are within said envelope.

20. A method, as recited in claim 1,
wherein said predetermined dV/V characteristic defines an acceptable power supply voltage level envelope within which devices and circuits defined on said integrated circuit are reliably operable.

21. A method, as recited in claim 1,
wherein said predetermined dV/V characteristic defines an acceptable power supply voltage level envelope as a function of operating frequency.

22. A method, as recited in claim 1,
wherein said predetermined dV/V characteristic is ±10% of a nominal power supply voltage less than about 2 V;
wherein a nominal operating frequency is greater than approximately 500 MHz; and
wherein said sub-nominal operating frequency is between 10 and 100 MHz.

23. A method, as recited in claim 1, wherein said integrated circuit includes a microprocessor.

24. A method, as recited in claim 1,
wherein said power distribution system includes a package with vias defined therein, said vias coupling power supply voltage nodes of a chip comprising said integrated circuit to a circuit board, and
wherein said power distribution system further includes decoupling capacitance placed to reduce sub-nominal operating frequency resonances therein.

25. A method for reducing disturbances in a power supply voltage delivered to a microprocessor integrated circuit chip by a power distribution system exhibiting increased AC impedance at mid-frequencies less than a nominal operating frequency of said microprocessor, said method comprising:
sensing said power supply voltage delivered to said microprocessor; and
regulating said power supply voltage on chip to within a power supply voltage level envelope within which devices and circuits of said microprocessor are reliably operable by performing a control action to reduce mid-frequency components of current supplied by said power distribution system.

26. A method, as recited in claim 25,
wherein said control action includes controllably varying current passed through a current dump circuit.

27. A method, as recited in claim 25,
wherein said control action includes controllably varying an actual operating frequency of at least a substantial portion of circuits of said microprocessor.

28. A method, as recited in claim 25,
wherein said control action includes controllably selecting one of a high current instance of circuitry for performing a function and a low current instance for performing said same function.

29. A method, as recited in claim 25,
wherein said sensing and said performing a control action to reduce mid-frequency components of current supplied by said power distribution system are at least at least partially performed by a non-linear resistor (NLR).

30. An integrated circuit chip comprising:
first circuitry defined thereon and operable to exhibit variations in current demand in response to temporal variations in an operating characteristic thereof, said circuitry couplable to define, in conjunction with components external to said integrated circuit chip, a power distribution system exhibiting AC impedance characteristics having a mid-frequency resonance, wherein said first circuitry is nominally operable at a high-frequency greater than said mid-frequency, and wherein said mid-frequency resonance is excitable by said variations in current demand to cause disturbances in power supply voltage delivered on-chip;

a feedback control circuit defined on said integrated circuit chip and responsive to said disturbances in power supply voltage to control overall current demand of said integrated circuit chip and thereby regulate said disturbances to within a design tolerance of said integrated circuit chip.

31. An integrated circuit chip, as in claim 30, wherein said excursions include:

voltage collapse in response to a positive variation in current demand associated with an increase in current required by said integrated circuit chip; and voltage overshoot in response to a negative variation in current demand associated with a decrease in current required by said integrated circuit chip.

32. An integrated circuit chip, as in claim 30, wherein said feedback control circuit adjusts an effective operating frequency said integrated circuit chip control said overall current demand and thereby regulate said excursions.

33. An integrated circuit chip, as in claim 30, wherein said integrated circuit chip further comprises a current dump circuit; and wherein said feedback control circuit adjusts an amount of current dumped through said current dump circuit to control said overall current demand and thereby regulate said excursions.

34. An integrated circuit chip, as in claim 30, wherein said temporal variations in said operating characteristic include temporal variations in a desired operating frequency.

35. An integrated circuit chip, as in claim 34, wherein said temporal variations in said desired operating frequency include transitions amongst a nominal operating frequency and a sleep or stop clock operating frequency;

said variations in current demand otherwise resulting from said temporal variations in said desired operating frequency and said excursions in power supply voltage otherwise associated therewith being regulated by said feedback control circuit, said feedback control circuit adjusting an effective operating frequency of said integrated circuit chip during said transitions to control said overall current demand and thereby regulate said excursions.

36. An integrated circuit chip, as in claim 34, wherein said temporal variations in said desired operating frequency include transitions amongst a nominal operating frequency and a sleep or stop clock operating frequency;

said variations in current demand otherwise resulting from said temporal variations in said desired operating frequency and said excursions in power supply voltage otherwise associated therewith being regulated by adjusting an amount of current dumped through a current dump circuit on said integrated circuit chip to control said overall current demand and thereby regulate said excursions.

37. An integrated circuit chip, as in claim 30, wherein said integrated circuit chip includes a processor operable to execute instructions; and wherein said temporal variations in said operating characteristic include instruction sequence dependent variations in current requirements of integrated circuit chip.

38. An integrated circuit chip, as in claim 30, wherein said high-frequency is greater than 500 MHz and said mid-frequency resonance ranges about 10 MHz to about 100 MHz.

39. An integrated circuit chip, as in claim 30, wherein said power supply voltage is less than approximately 2 V and wherein said an average value of said overall current is greater than approximately 20 Amps.

40. An integrated circuit chip, as in claim 30, wherein said design tolerance is approximately ±10% of a nominal value of said power supply voltage.

41. An integrated circuit chip, as in claim 30, wherein said high-frequency is greater than 500 MHz.

42. An apparatus comprising:

a microprocessor defined on an integrated circuit chip having power supply nodes for coupling to a power distribution system exhibiting increased AC impedance at mid-frequencies less than a nominal operating frequency of said microprocessor;

sensing means for sensing power supply voltage delivered at said power supply nodes; and regulating means for regulating said power supply voltage on chip to within a power supply voltage level envelope within which devices and circuits of said microprocessor are reliably operable, said regulating means performing a control action to reduce mid-frequency components of current supplied by said power distribution system.

43. An apparatus, as in claim 42, wherein said sensing means and said regulating means comprise non-linear resistor (NLR) means for varying a current dump path resistance as a function of power supply voltage on chip and thereby at least partially regulating said power supply voltage on chip to within said power supply voltage level envelope.

\* \* \* \* \*